US010431591B2

(12) United States Patent
Goda et al.

(10) Patent No.: US 10,431,591 B2
(45) Date of Patent: Oct. 1, 2019

(54) NAND MEMORY ARRAYS

(71) Applicant: Micron Technology, Inc., Boise, ID (US)

(72) Inventors: Akira Goda, Boise, ID (US); Yushi Hu, McLean, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/422,307

(22) Filed: Feb. 1, 2017

(65) Prior Publication Data

US 2018/0219017 A1 Aug. 2, 2018

(51) Int. Cl.
*H01L 27/115* (2017.01)
*H01L 27/11582* (2017.01)
*H01L 21/28* (2006.01)

(52) U.S. Cl.
CPC .. *H01L 27/11582* (2013.01); *H01L 21/28282* (2013.01)

(58) Field of Classification Search
CPC ............................................ H01L 2224/48247
See application file for complete search history.

(56) References Cited

U.S. PATENT DOCUMENTS

| 7,829,938 | B2 * | 11/2010 | Bhattacharyya ... G11C 16/0483 257/325 |
| 8,462,557 | B2 | 6/2013 | Bhattacharyya |
| 8,643,084 | B2 | 2/2014 | Shin |
| 9,136,130 | B1 | 9/2015 | Wada |
| 9,177,965 | B2 | 11/2015 | Lee |
| 9,305,937 | B1 * | 4/2016 | Tsutsumi .......... H01L 27/11582 |
| 9,362,303 | B2 * | 6/2016 | Lee .................. H01L 27/11582 |
| 9,478,558 | B2 | 10/2016 | Koka |
| 9,620,512 | B1 | 4/2017 | Nishikawa |
| 9,627,399 | B2 | 4/2017 | Kanakamedala |
| 9,659,949 | B2 | 5/2017 | Zhu |
| 9,711,229 | B1 * | 7/2017 | Rabkin ................. G11C 16/16 |
| 9,728,546 | B2 * | 8/2017 | Serov ................ H01L 27/11556 |
| 9,741,737 | B1 * | 8/2017 | Huang ................ H01L 23/5226 |
| 9,922,992 | B1 | 3/2018 | Yu |
| 9,985,049 | B1 | 5/2018 | Sandhu |
| 2007/0112988 | A1 | 1/2007 | Bhattacharyya |
| 2011/0147823 | A1 | 6/2011 | Kuk |

(Continued)

FOREIGN PATENT DOCUMENTS

KR 2008-0027946 3/2008
KR 10-2014-0114536 9/2014
(Continued)

*Primary Examiner* — Thao P Le
(74) *Attorney, Agent, or Firm* — Wells St. John P.S.

(57) ABSTRACT

Some embodiments include a NAND memory array which has a vertical stack of alternating insulative levels and wordline levels. The wordline levels have terminal ends corresponding to control gate regions. Charge-trapping material is along the control gate regions of the wordline levels, and is spaced form the control gate regions by charge-blocking material. The charge-trapping material along vertically adjacent wordline levels is spaced by intervening regions through which charge migration is impeded. Channel material extends vertically along the stack and is spaced from the charge-trapping material by charge-tunneling material. Some embodiments include methods of forming NAND memory arrays.

25 Claims, 22 Drawing Sheets

(56) References Cited

U.S. PATENT DOCUMENTS

| | | |
|---|---|---|
| 2011/0273931 A1 | 11/2011 | Bhattacharyya |
| 2012/0001249 A1 | 1/2012 | Alsmeier |
| 2012/0104484 A1 | 5/2012 | Lee |
| 2012/0156848 A1 | 6/2012 | Yang |
| 2013/0148398 A1 | 6/2013 | Baek |
| 2014/0231954 A1 | 8/2014 | Lue |
| 2014/0264532 A1 | 9/2014 | Dennison |
| 2014/0339624 A1* | 11/2014 | Ramaswamy ........ H01L 29/792 257/326 |
| 2015/0069494 A1 | 3/2015 | Makala |
| 2015/0294980 A1 | 10/2015 | Lee |
| 2015/0364483 A1 | 12/2015 | Koval |
| 2016/0056168 A1 | 2/2016 | Lue |
| 2016/0126248 A1* | 5/2016 | Rabkin ................ H01L 29/408 257/321 |
| 2016/0149004 A1 | 5/2016 | Rabkin |
| 2016/0181272 A1 | 6/2016 | Rabkin |
| 2016/0190155 A1 | 6/2016 | Lee |
| 2016/0211272 A1 | 7/2016 | Koka |
| 2016/0233225 A1 | 8/2016 | Zhu |
| 2016/0268209 A1 | 9/2016 | Pachamuthu |
| 2016/0284719 A1 | 9/2016 | Zhu |
| 2016/0293621 A1 | 10/2016 | Huang |
| 2016/0365407 A1 | 12/2016 | Lue |
| 2017/0025431 A1 | 1/2017 | Kanakamedala |
| 2017/0125436 A1* | 5/2017 | Sharangpani ..... H01L 27/11582 |
| 2017/0229470 A1 | 8/2017 | Zhu |
| 2017/0236896 A1* | 8/2017 | Lu ....................... H01L 29/0649 257/314 |
| 2017/0243650 A1* | 8/2017 | Ogawa ............... G11C 16/0483 |
| 2017/0278859 A1 | 9/2017 | Sharangpani |
| 2017/0373197 A1 | 12/2017 | Sharangpani |
| 2018/0090373 A1 | 3/2018 | Sharangpani |
| 2018/0226425 A1 | 8/2018 | Purayath |
| 2018/0269229 A1 | 9/2018 | Or-Bach |

FOREIGN PATENT DOCUMENTS

| | | |
|---|---|---|
| WO | WO PCTUS2018-016144 | 4/2018 |
| WO | WO PCTUS2018-016468 | 5/2018 |

* cited by examiner

NAND MEMORY ARRAYS

TECHNICAL FIELD

NAND memory arrays, and methods of forming NAND memory arrays.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells. It is desired to develop improved NAND architecture.

DETAILED DESCRIPTION OF THE ILLUSTRATED EMBODIMENTS

Operation of NAND memory cells comprises movement of charge between a channel material and a charge-storage material. For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with electrons stored in the charge-storage material, and thereby release charge from the charge-storage material. The charge-storage material may comprise charge-trapping material (for instance, silicon nitride, metal dots, etc.). A problem with conventional NAND can be that charge-trapping material extends across multiple memory cells of a memory array, and can enable charge migration between the cells. The charge migration between memory cells may lead to data retention problems. Some embodiments include structures which impede migration of charge between memory cells. In example embodiments, the structures utilized to impede charge migration may be thinned regions of the charge-trapping material in regions between memory cells, or may be breaks in the charge-trapping material in regions between memory cells. Example embodiments are described with reference to FIGS. 1-22.

Figure 1:
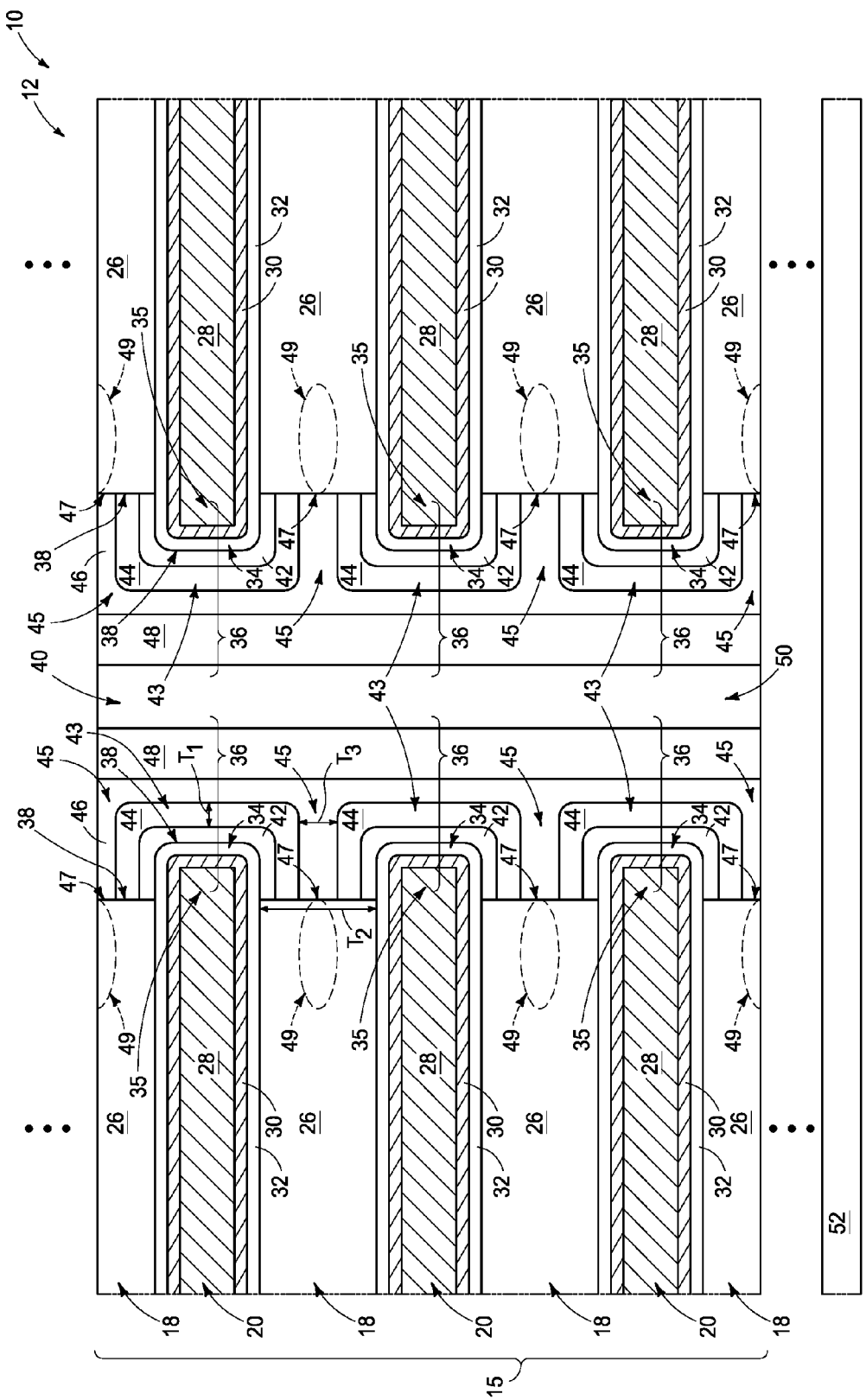
FIG. 1 is a diagrammatic cross-sectional side view of an example integrated structure having a region of an example NAND memory array.

Referring to FIG. 1, a portion of an integrated structure 10 is illustrated, with such portion including a fragment of a three-dimensional NAND memory array 12.

The integrated structure 10 comprises a stack 15 of alternating first and second levels 18 and 20. The levels 18 are insulative (i.e. dielectric), and the levels 20 are conductive.

The insulative levels 18 comprise insulative material 26. Such insulative material may comprise any suitable composition or combination of compositions; and may, for example, comprise silicon dioxide.

The conductive levels 20 comprise conductive materials 28 and 30. The conductive material 28 may be considered to be a conductive core, and the conductive material 30 may be considered to be an outer conductive layer surrounding the conductive core. The conductive materials 28 and 30 may comprise different compositions relative to one another. In some embodiments, the conductive material 28 may comprise, consist essentially of, or consist of one or more metals (for instance, tungsten, titanium, etc.), and the conductive material 30 may comprise, consist essentially of, or consist of one or more metal-containing compositions (for instance, metal nitride, metal silicide, metal carbide, etc.). In some embodiments, the conductive core material 28 may comprise, consist essentially of, or consist of one or more metals (for instance, tungsten, titanium, etc.), and the surrounding conductive material 30 may comprise, consist essentially of, or consist of one or more metal nitrides (for instance, titanium nitride, tungsten nitride, etc.).

The materials 28/30 illustrate an example configuration of the conductive levels 20. In other embodiments, the conductive levels 20 may comprise other configurations of conductive material; and may, for example, comprise a single conductive material or more than the illustrated two conductive materials. Generally, the conductive levels 20 may comprise conductive material having any suitable composition or combination of compositions; and may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.).

Insulative material 32 forms an insulative liner surrounding the outer conductive layer of material 30. The insulative material 32 may comprise high-k material (for instance, one or more of aluminum oxide, hafnium oxide, zirconium oxide, tantalum oxide, etc.); where the term "high-k" means a dielectric constant greater than that of silicon dioxide. Although the insulative material 32 is shown to be a single homogenous material, in other embodiments the insulative material may comprise two or more discrete compositions. For instance, in some embodiments the insulative material 32 may comprise a laminate of silicon dioxide and one or more high-k materials. In some embodiments, the insulative material 32 may be referred to as a charge-blocking material.

In some embodiments, the conductive levels 20 may be considered to be wordline levels of a NAND memory array. Terminal ends 34 of the wordline levels 20 may function as control gate regions 35 of NAND memory cells 36, with approximate locations of the memory cells 36 being indicated with brackets in FIG. 1.

The conductive levels 20 and insulative levels 18 may be of any suitable vertical thicknesses. In some embodiments, the conductive levels 20 and the insulative levels 18 may have vertical thicknesses within a range of from about 10 nanometers (nm) to about 300 nm. In some embodiments, the conductive levels 20 may have about the same vertical thicknesses as the insulative levels 18. In other embodiments, the conductive levels 20 may have substantially different vertical thicknesses than the insulative levels 18.

The vertically-stacked memory cells 36 form a vertical string (such as, for example, a vertical NAND string of memory cells), with the number of memory cells in each string being determined by the number of conductive levels 20. The stack may comprise any suitable number of conductive levels. For instance, the stack may have 8 conductive levels, 16 conductive levels, 32 conductive levels, 64 conductive levels, 512 conductive levels, 1028 conductive levels, etc.

The insulative materials 26 and 32 may be considered to form sidewalls 38 of an opening 40 extending through stack 15, with such sidewalls undulating inward along material 26, and outward along the material 32. The opening 40 may have a continuous shape when viewed from above; and may be, for example, circular, elliptical, etc. Accordingly, the sidewalls 38 of FIG. 1 may be comprised by a continuous sidewall that extends around the periphery of opening 40.

Charge-blocking material 42 extends along the terminal ends 34 of wordline levels 20, and is spaced from conductive material 30 of the wordline levels 20 by the insulative material 32. In the illustrated embodiment, the charge-blocking material 42 wraps around the terminal ends 34 of the wordline levels 20.

The charge-blocking material 42 forms charge-blocking regions of the memory cells 30. The charge-blocking material 42 may comprise any suitable composition or combination of compositions; including, for example, silicon dioxide, one or more high-k dielectric materials, etc. In some embodiments, the insulative material 32 and charge-blocking material 42 together form charge-blocking regions of the memory cells 36.

Charge-storage material 44 extends along the terminal ends 34 (i.e., control gate regions 35) of wordline levels 20, and is spaced from the terminal ends 34 by the charge-blocking materials 32/42. The charge-storage material 44 may comprise any suitable composition or combination of compositions; and in some embodiments, may comprise floating gate material (for instance, doped or undoped silicon) or charge-trapping material (for instance, silicon nitride, metal dots, etc.). In some embodiments, the charge-storage material 44 may comprise, consist essentially of, or consist of material comprising silicon and nitrogen. In some embodiments, the charge-storage material 44 may consist of silicon nitride, and may have a horizontal thickness $T_1$ within a range of from about 3 nm to about 10 nm. In some aspects, a "charge trap" refers to an energy well that can reversibly capture a charge carrier (e.g., an electron or hole).

The charge-storage material 44 is provided in vertically-stacked segments 43, which are spaced from one another by gaps 45. The gaps 45 may be referred to as intervening regions through which charge migration is impeded. In some embodiments, the charge-storage material 44 comprises charge-trapping material (e.g., silicon nitride), and the gaps 45 prevent charge from migrating between vertically-adjacent memory cells 36. In contrast, conventional three-dimensional NAND memory arrays may have a continuous layer of charge-trapping material extending along all of the vertically-stacked memory cells of a NAND string, and such may undesirably enable charge-migration between the memory cells of the NAND string and data loss. The embodiment of FIG. 1 may have improved data retention as compared to such conventional three-dimensional NAND memory arrays.

Gate-dielectric material 46 extends vertically along the charge-storage material 42, and extends into the gaps 45. The gate-dielectric material 46 may comprise any suitable composition or combination of compositions; and in some embodiments may comprise, consist essentially of, or consist of silicon dioxide. The gate-dielectric material 46 forms gate dielectric regions of memory cells 36. In some embodiments, the insulative material 26 of levels 18 may be considered to be first insulative material, and the gate-dielectric material 46 may be considered to be second insulative material which is within gaps 45 between the segments of charge-storage material 44. The first and second insulative materials 26 and 46 may be the same composition as one another in some embodiments (for instance, both may comprise, consist essentially of, or consist of silicon dioxide), or may be compositionally different from one another in other embodiments. The first and second insulative materials 26 and 46 join to one another along interfaces 47. In some embodiments, voids 49 (shown in dashed line to indicate that they are optional) may extend into the first insulative material 26 along the interfaces 47. The voids 49 may form during deposition of material 26, as discussed in more detail below with reference to FIG. 10. The gate-dielectric material can function as a material through which charge carriers tunnel or otherwise pass during programming operations, erasing operations, etc. In some contexts, the gate-dielectric material may be referred to simply as an insulative material or a dielectric material.

In the shown embodiment, the first insulative material 26 has a vertical thickness $T_2$ along the interface 47, and the second insulative material 46 has a vertical thickness $T_3$ along the interface 47. The vertical thickness $T_3$ is less than the vertical thickness $T_2$, and in some embodiments may be less than or equal to about one-half of the vertical thickness $T_2$. The vertical thicknesses $T_2$ and $T_3$ of materials 26 and 46 may be referred to as first and second vertical thickness, respectively, in some embodiments.

Channel material 48 extends vertically along the gate-dielectric material 46 (and, in some embodiments may be considered to extend vertically along the stack 15), and is spaced from the charge-storage material 44 by the gate-dielectric material 46. The channel material 48 may comprise any suitable composition or combination of compositions; and in some embodiments may comprise, consist essentially of, or consist of appropriately-doped silicon. The channel material is referred to as "extending vertically" to indicate that it generally extends through the stack 15. The vertically-extending material 48 (and other materials described herein as extending vertically) may extend substantially orthogonally relative to upper surfaces of the levels 18 and 20 (as shown), or not; depending on, for example, whether opening 40 has sidewalls which are substantially orthogonal to the upper surfaces of the levels 18 and 20, or not.

In some embodiments, the gate-dielectric material 46 may be considered to be a charge-tunneling material; i.e., to be a material through which charge tunnels between the charge-storage material 44 and the channel material 48 of the memory cells 36 during programming operations, erasing operations, etc. The charge-tunneling material may comprise silicon dioxide, as described above, or may comprise bandgap-engineered materials (such as silicon nitride laterally sandwiched between two oxides, where one or both to the oxides may be silicon dioxide).

In the illustrated embodiment, an insulative region 50 extends along a middle of opening 40. The insulative region 50 may comprise any suitable insulative composition; including, for example, silicon dioxide, silicon nitride, etc. Alternatively, at least a portion of the insulative region 50 may be a void. The illustrated embodiment having the insulative region 50 extending down the middle of opening 40 is a so-called hollow-channel configuration. In other embodiments, the channel material 48 may entirely fill the central region of opening 40 to form a vertically-extending pedestal within such central region.

The stack 15 is supported by a base 52. A break is provided between the base 52 and the stack 15 to indicate that there may be additional materials and/or integrated circuit structures between the base 52 and the stack 15. In some applications, such additional integrated materials may include, for example, source-side select gate material (SGS material).

The base 52 may comprise semiconductor material; and may, for example, comprise, consist essentially of, or consist of monocrystalline silicon. The base 52 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 52 may correspond to a semiconductor substrate containing one or more materials associated with integrated circuit fabrication. Such materials may include, for example, one or more of refractory metal materials, barrier materials, diffusion materials, insulator materials, etc.

Figure 2:
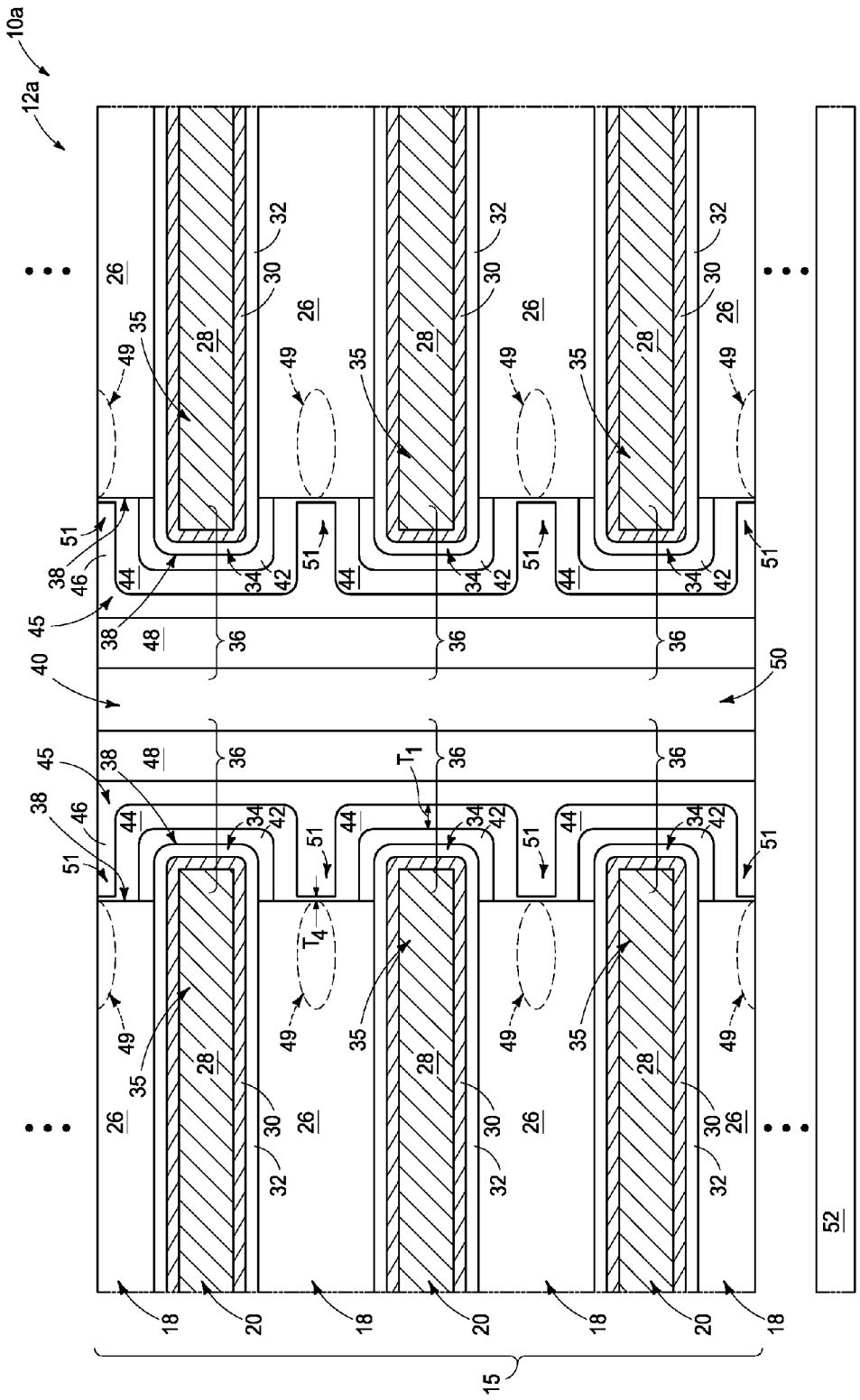
FIG. 2 is a diagrammatic cross-sectional side view of another example integrated structure having a region of another example NAND memory array.

FIG. 2 shows a construction 10a having a NAND memory array 12a illustrating another example configuration. The configuration of FIG. 2 is similar to that of FIG. 1, except that the gaps 45 (FIG. 1) are replaced with thinned regions 51 of charge-storage material 44. The thinned regions 51 have a thickness $T_4$ which is much less than the thickness $T_1$ of the charge-storage material along the control gate regions 35. The thinned regions 51 are formed to be thin enough to impede charge migration, and accordingly correspond to intervening regions between memory cells 36 which impede charge migration from one memory cell to another. In some embodiments, the thickness $T_4$ of the thinned regions 51 may be less than on-half of the thickness $T_1$ of the charge-storage material segments within the memory cells 36. In some embodiments, the thickness $T_4$ of the thinned regions 51 may be less than about 2 nm, less than about 1 nm, less than about 0.5 nm, etc. In some embodiments, the thinned regions 51 may be about 1 monolayer thick.

The three-dimensional NAND configurations of FIGS. 1 and 2 may be fabricated utilizing any suitable methodology. Example methodology is described with reference to FIGS. 3-22. A first example embodiment method is described with reference to FIGS. 3-12.

Figure 3:
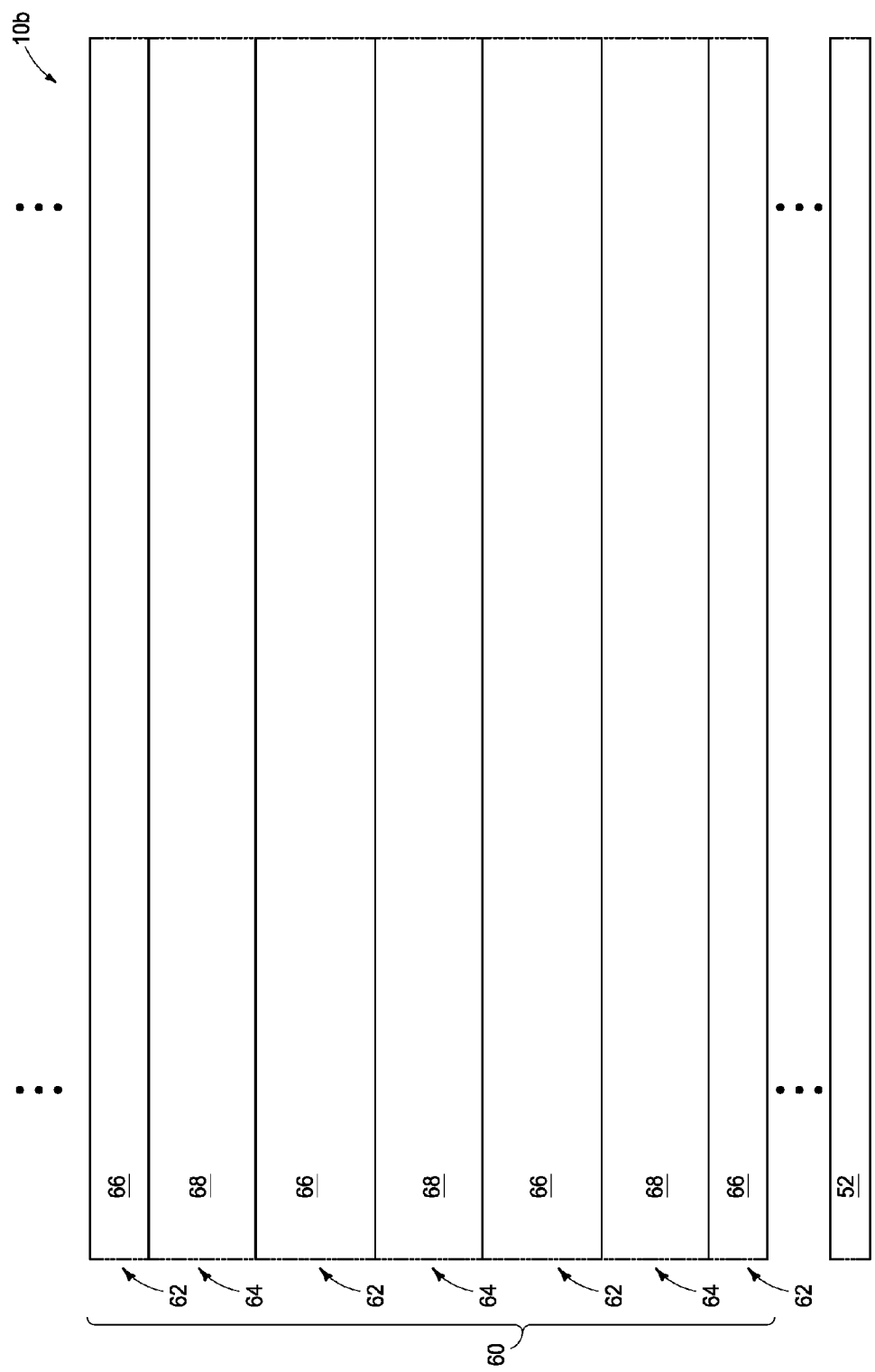
FIGS. 3-12 are diagrammatic cross-sectional side views of an example integrated structure at process stages of an example method.

Referring to FIG. 3, a construction 10b includes a vertical stack 60 of alternating first levels 62 and second levels 64 over the base 52. The first levels 62 comprise first material 66, and the second levels 64 comprise second material 68. The first and second materials 66 and 68 may comprise any suitable compositions or combinations of compositions. The first material 66 is selectively removable relative to the second material 68, and vice versa. In some embodiments, the first material 66 comprises, consists essentially of, or consists of silicon dioxide; and the second material 68 comprises, consists essentially of, or consists of silicon nitride.

Figure 4:
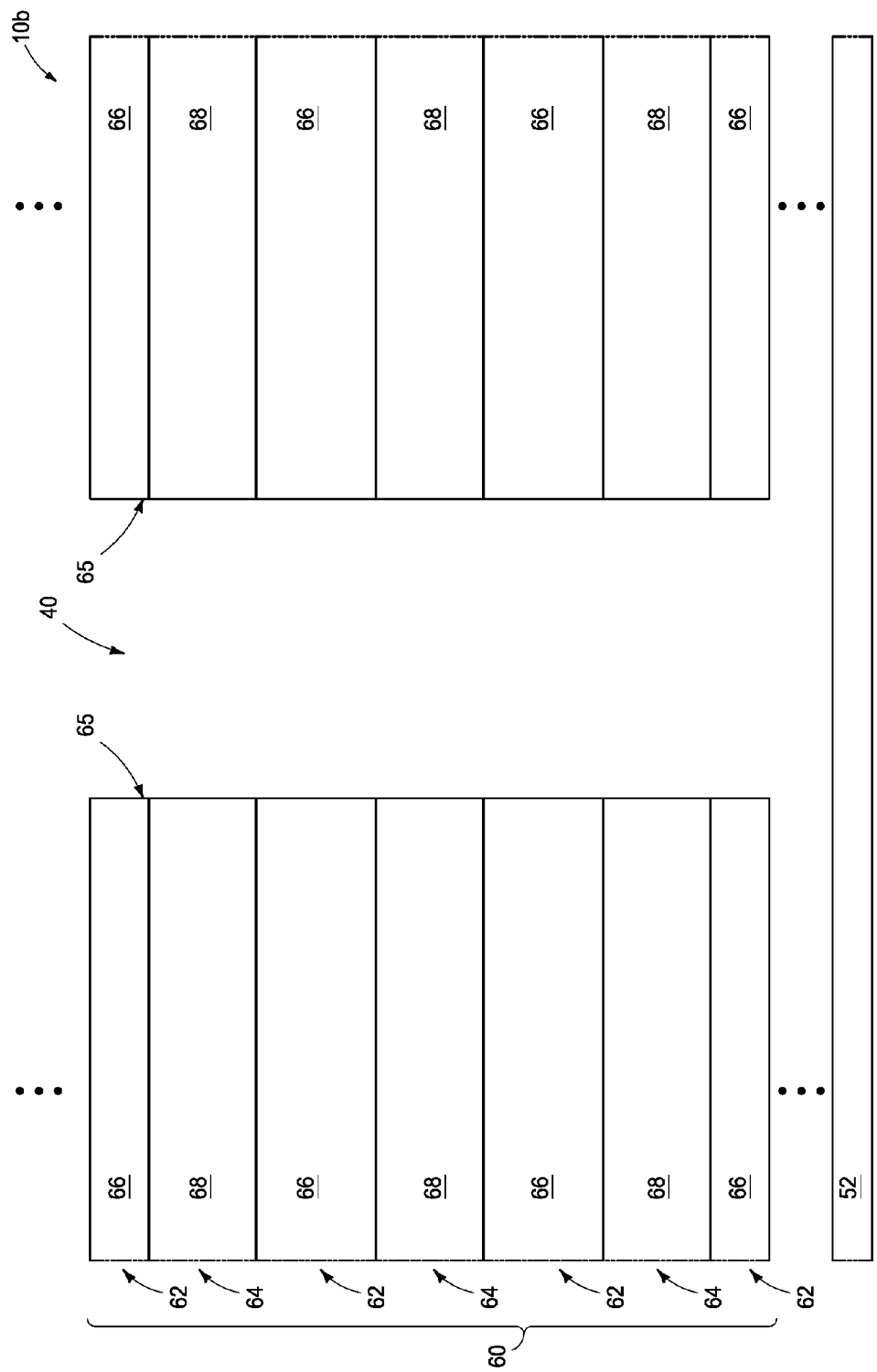

Referring to FIG. 4, the opening 40 is formed to extend through the stack 60. The opening 40 may be formed utilizing any suitable methodology. For instance, a patterned mask (not shown) may be formed over the stack 60 to define a location of the opening 40, and then the opening 40 may be formed to extend through the stack 60 with one or more suitable etches. Subsequently, the patterned mask may be removed.

The opening 40 has sidewalls 65 extending along the first and second materials 66 and 68.

Figure 5:
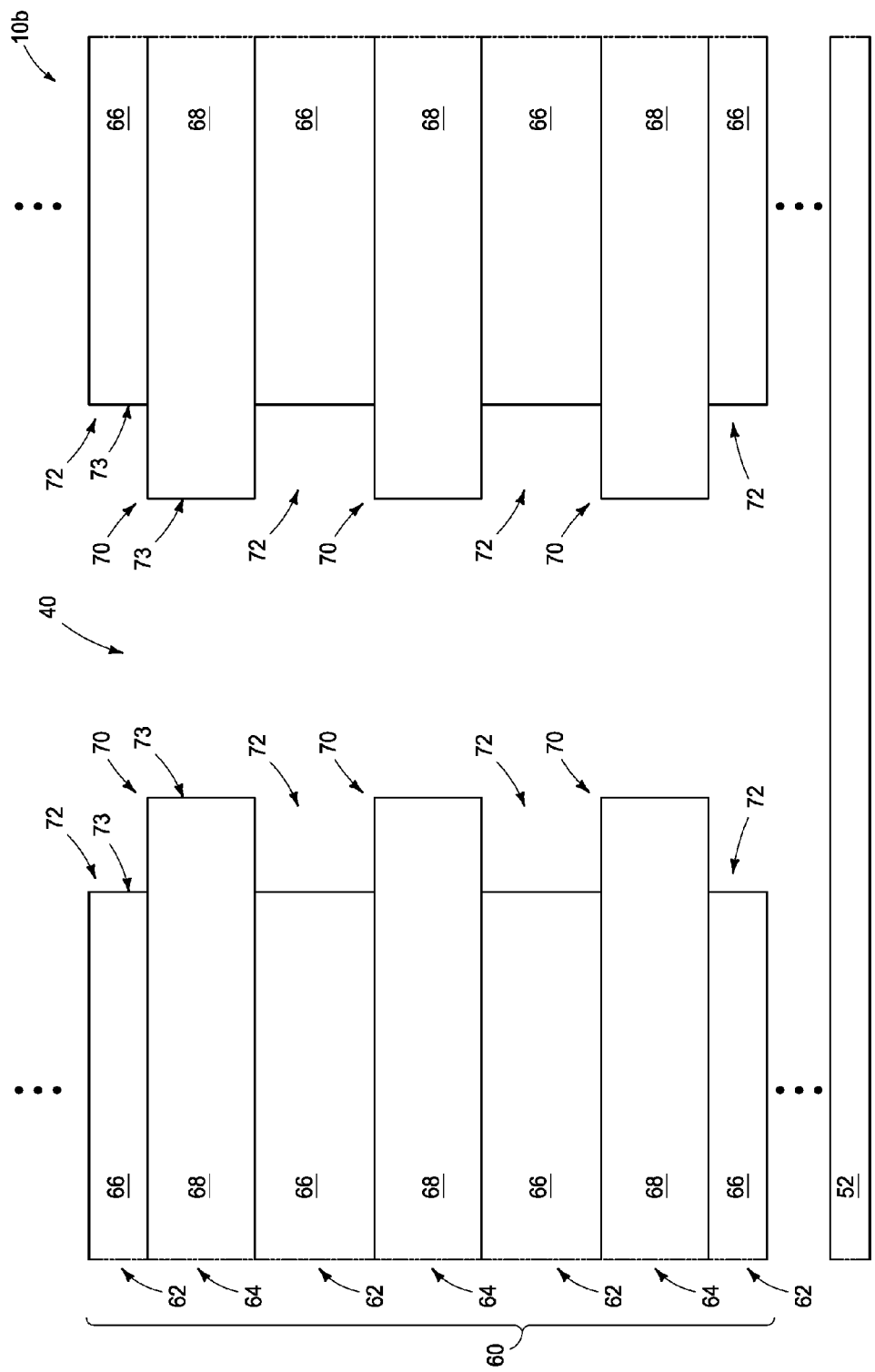

Referring to FIG. 5, the first levels 62 are recessed relative to the second levels 64. Such recessing may be accomplished utilizing any suitable etch selective for the first material 66 relative to the second material 68. After the first levels 62 are recessed, the second levels 64 have projecting terminal ends 70 which extend outwardly beyond the recessed first levels 62. Cavities 72 extend into the first levels 62 between the projecting terminal ends 70. Undulating sidewall surfaces 73 of opening 40 extend into cavities 72 and around the projecting terminal ends 70.

Figure 6:
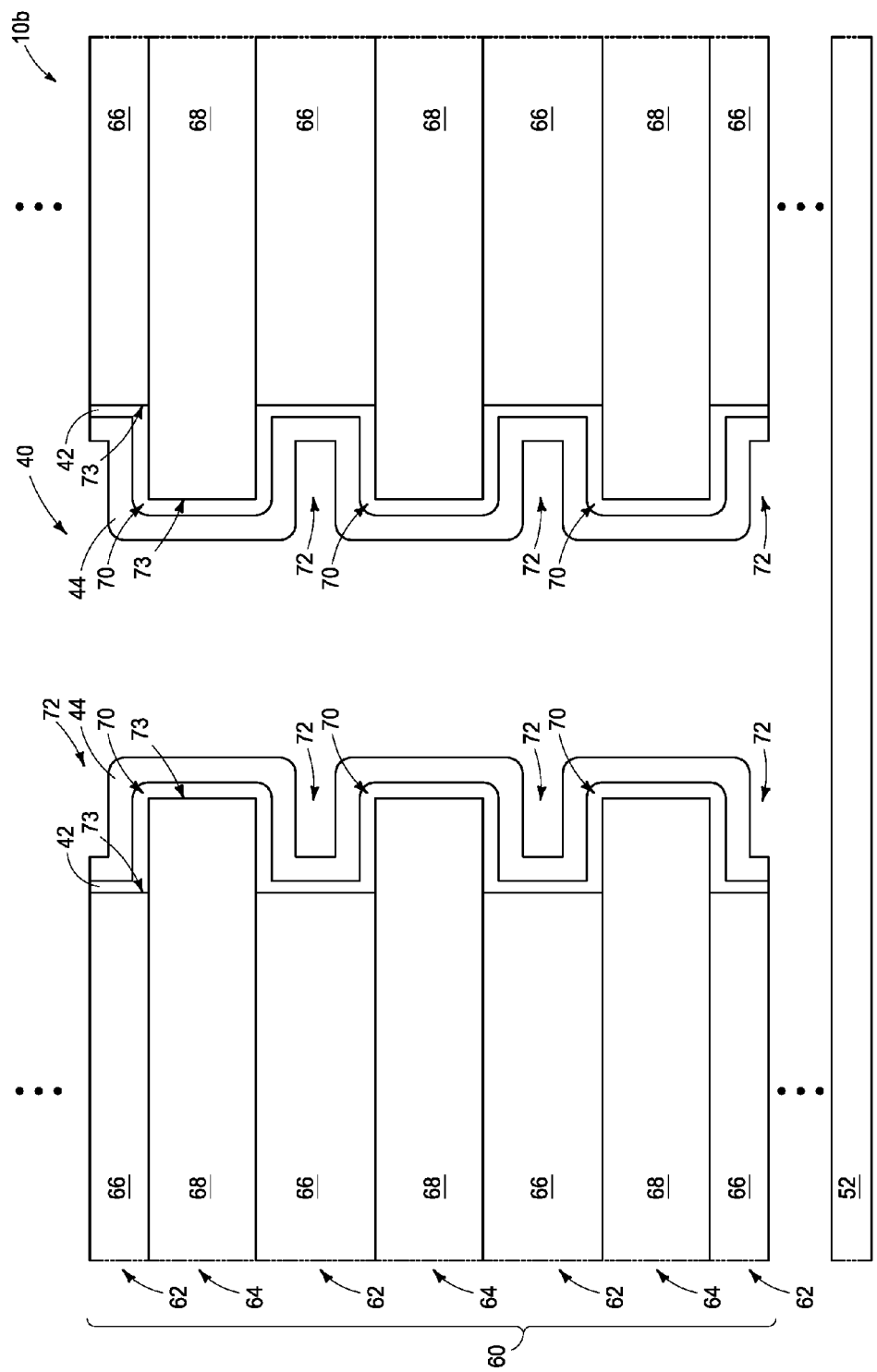

Referring to FIG. 6, charge-blocking material 42 is formed along the undulating sidewall surfaces 73, and charge-storage material 44 is formed along the charge-blocking material 42. The materials 42/44 extend into the cavities 72 and around the projecting terminal ends 70. In some embodiments, the materials 42/44 may be considered to line the cavities 72. A charge block may have the following functions in a memory cell: in a program mode, the charge block may prevent charge carriers from passing out of the charge-storage material (e.g., floating-gate material, charge-trapping material, etc.) toward the control gate; and in an erase mode, the charge block may prevent charge carriers from flowing into the charge-storage material from the control gate. A charge-blocking region may comprise any suitable material(s) or structure(s) providing desired charge-blocking properties; and may, for example, comprise: an insulative material between control gate and charge-storage material; an outermost portion of a charge-trapping material where such material is dielectric and independent of where "charge" is stored in such portion; an interface between the control gate and the charge-trapping material, etc.

Figure 7:
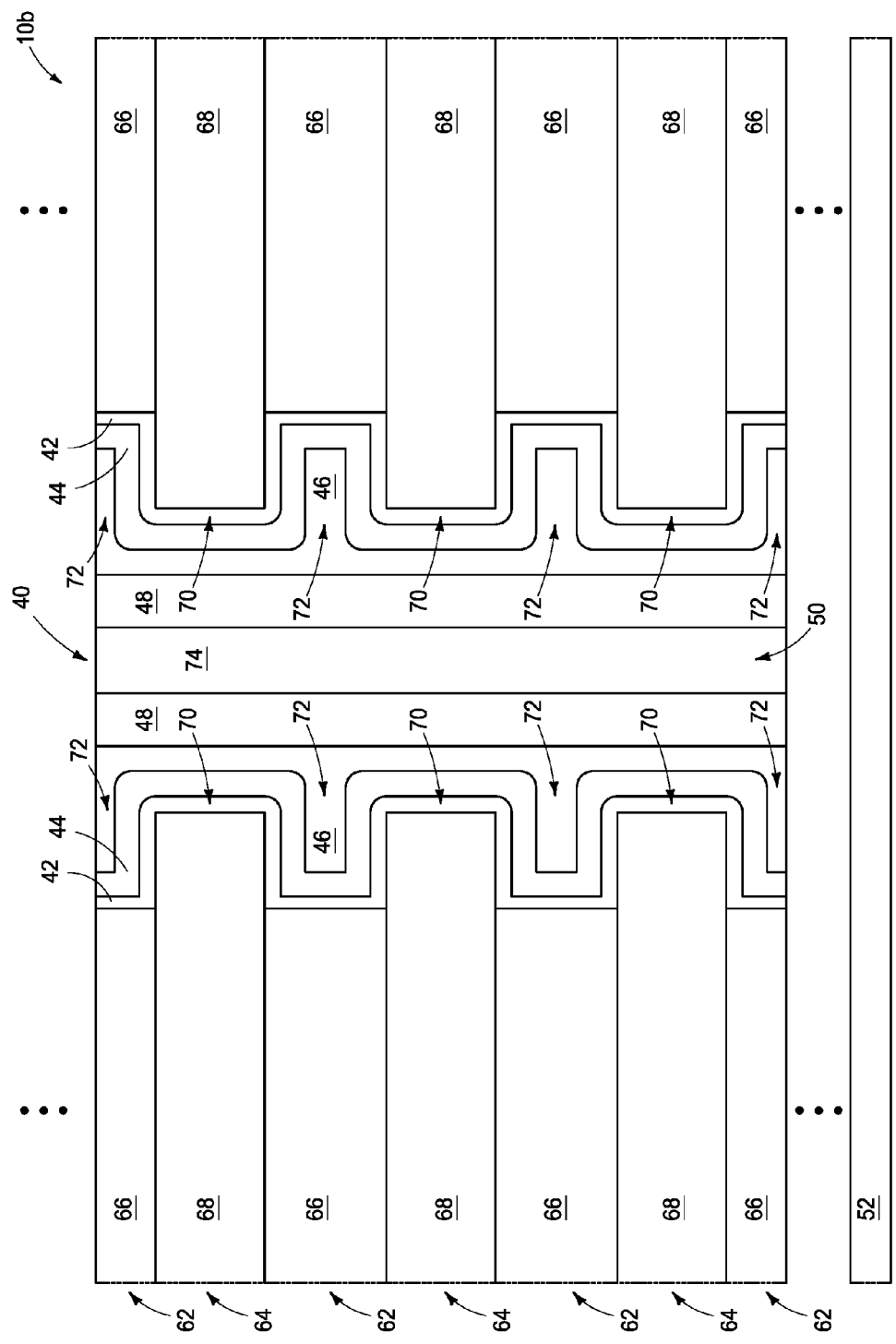

Referring to FIG. 7, gate-dielectric material 46 is formed to extend vertically along the charge-storage material 44, and to fill the cavities 72. Channel material 48 is formed to extend vertically along the gate-dielectric material 46. Insulative material 74 is then formed within a remaining central region of opening 40. The insulative material 74 forms the insulative region 50 described above with reference to FIG. 1; and may comprise any suitable composition or combination of compositions (such as, for example, silicon nitride, silicon dioxide, etc.). In some embodiments, the insulative material 74 may be omitted and a void may be left within the central region of opening 40. Alternatively, channel material 48 may be formed to entirely fill the opening 40.

Figure 8:
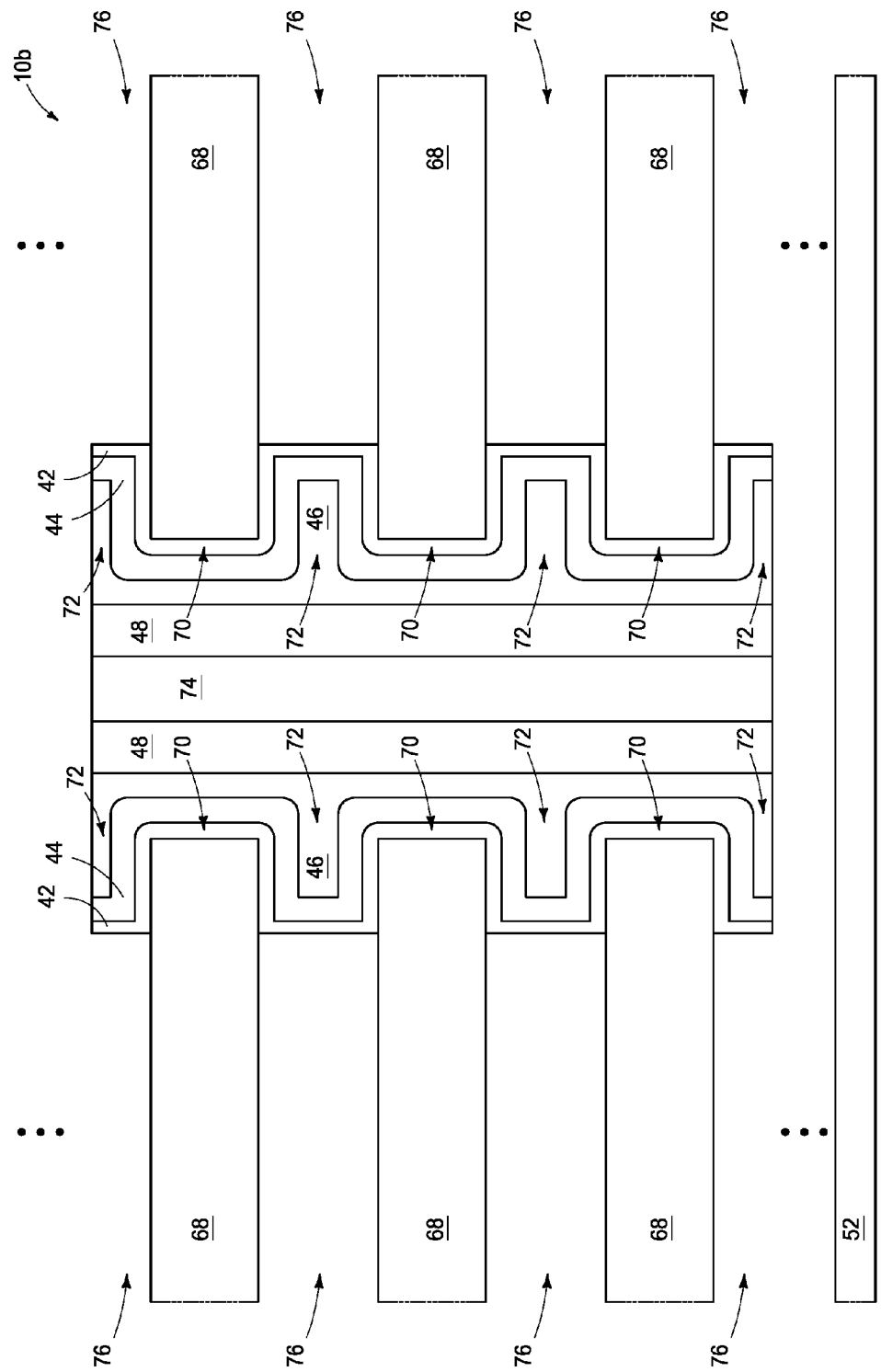

Referring to FIG. 8, the first material 66 (FIG. 7) is removed to leave voids 76. Such removal may be accomplished with any suitable etch which is selective for the first material 66 relative to the second material 68. In a processing step which is not shown, slits may be formed through stack 60 (FIG. 7) to provide access to the first and second levels 62/64 (FIG. 7). Etchant may be flowed into such slits to access the first material 66 (FIG. 7).

Figure 9:
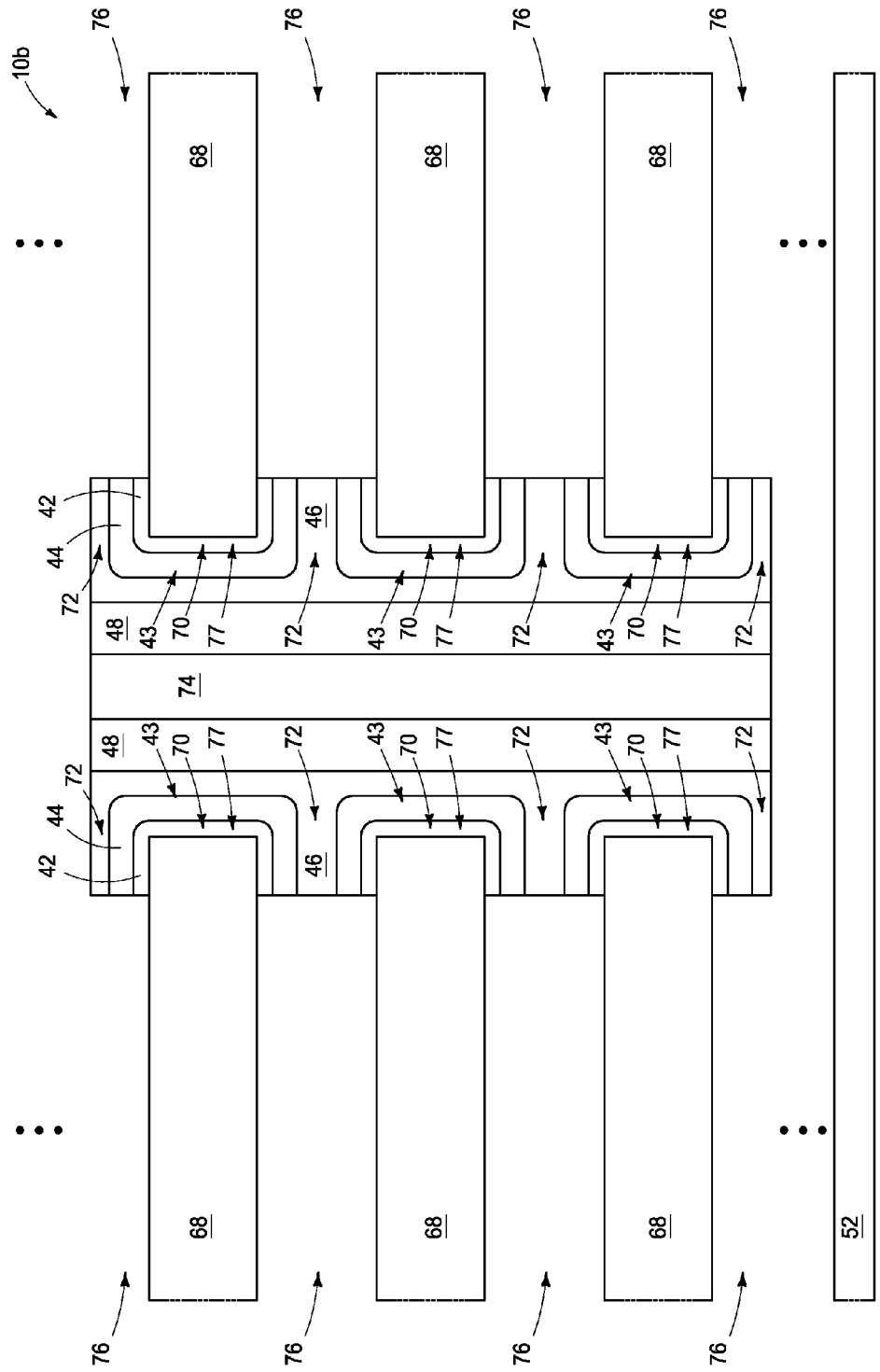

Referring to FIG. 9, the charge-blocking material 42 and charge-storage material 44 are etched with etchant provided in voids 76. The etching removes regions of the charge-storage material 42 and the charge-blocking material 44 within the cavities 72 to expose surfaces of the gate-dielectric material 46; and to pattern the charge-storage material 42 and the charge-blocking material 44 into segments 77 and 43, respectively, that extend around the projections 70.

The etching of one or both of the charge-blocking material 42 and charge-storage material 44 from within voids 76 may be conducted with a same etchant as is utilized to form the voids 76, or may be conducted with a different etchant than that utilized to form the voids 76.

Figure 10:
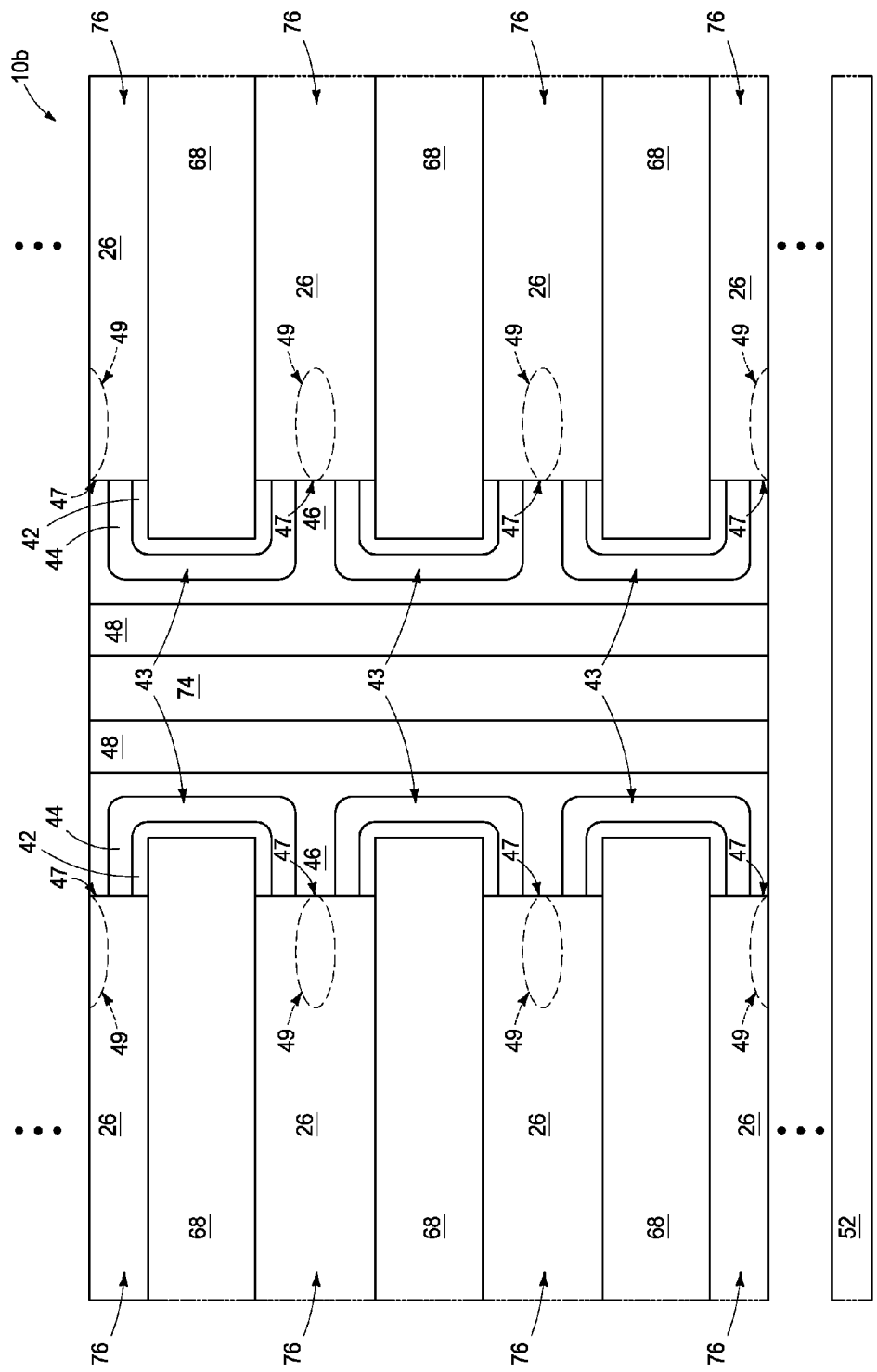

Referring to FIG. 10, insulative material 26 is formed within voids 76. The insulative material 26 may be referred to as a third material in some embodiments, to distinguish it from the first and second materials 66 and 68 of FIG. 3. The voids 49 (shown in dashed line to indicate that they are optional) may or may not remain as keyhole voids within material 26 after deposition of material 26 within the voids 76, depending on, for example, the composition of material 26, the deposition conditions utilized, etc. The material 26 contacts the gate-dielectric material 46 along interfaces 47 in the shown embodiment.

Figure 11:
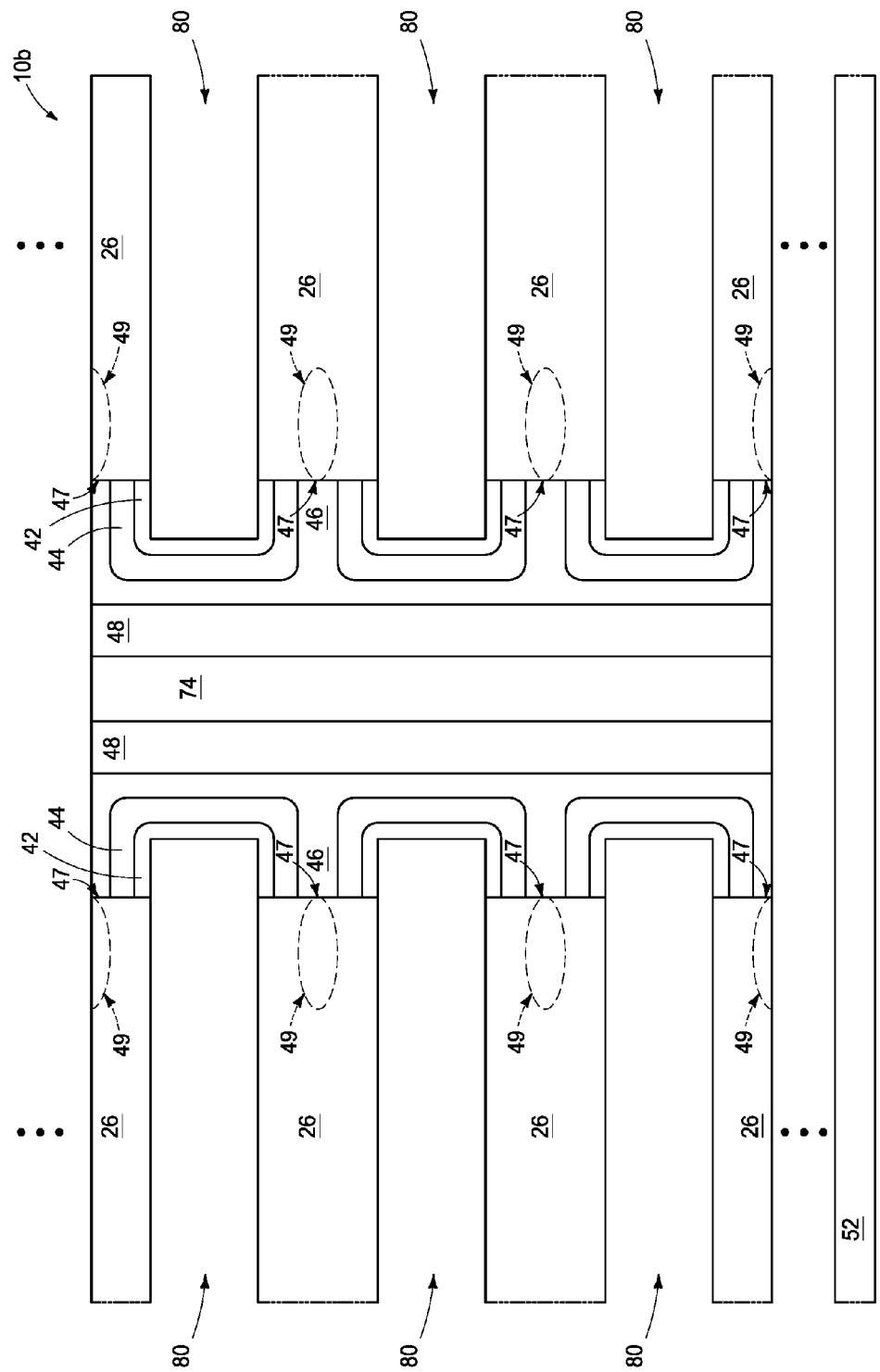

Referring to FIG. 11, the second material 68 (FIG. 10) is removed to leave voids 80. Such removal may be accomplished with any suitable etch which is selective for the second material 68 relative to the materials 26 and 42. The voids 80 may be referred to as second voids to distinguish them from the first voids 76 formed at the processing stage of FIG. 8. The term "first voids" may be utilized to refer to voids formed by removing first material 66 (FIG. 3), and the term "second voids" may be utilized to refer to voids formed by removing second material 68. The second voids may be formed after the first voids, as shown in the processing of FIGS. 8-11; or may be formed before the first voids (as shown in processing described below with reference to FIGS. 13-15).

The optional voids 49 may be referred to as third voids in some embodiments to distinguish them from the first and second voids 76 and 80.

Figure 12:
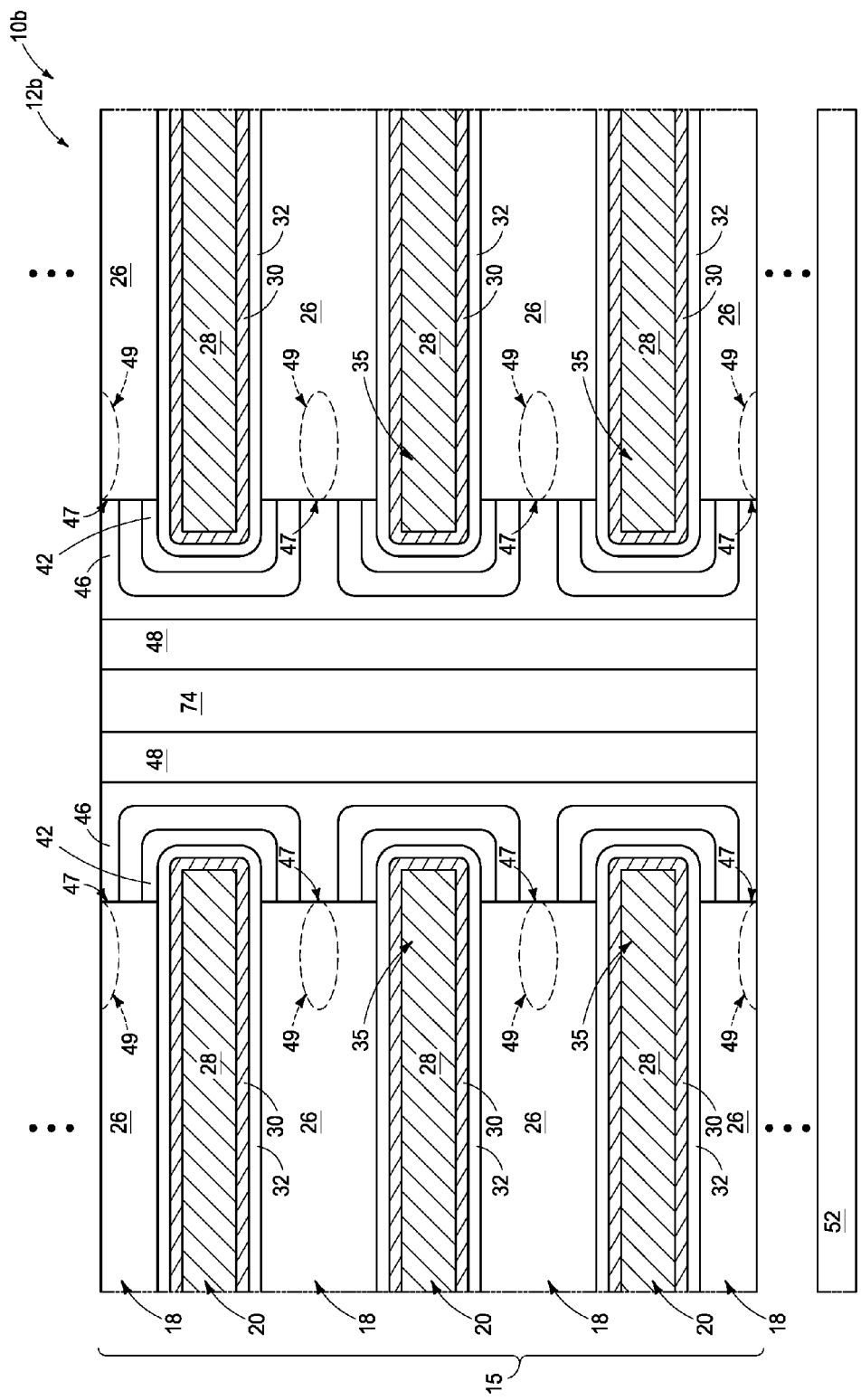

Referring to FIG. 12, insulative material 32 is formed within voids 80 (FIG. 10) to line the voids, and thereby become an insulative liner within the voids. The insulative material 32 may comprise high-k material (for instance, one or more of aluminum oxide, hafnium oxide, zirconium oxide, tantalum oxide, etc.) as discussed above with reference to FIG. 1, and may be a charge-blocking material.

Conductive material 30 is formed within the lined voids 80 (FIG. 10) after forming insulative material 32, and then conductive material 28 is formed within the voids 80 (FIG. 10). The conductive material 28 may be considered to be a conductive core (as discussed above with reference to FIG. 1), and the conductive material 30 may be considered to be an outer conductive layer surrounding the conductive core (as is also discussed above regarding FIG. 1).

The construction 10b of FIG. 12 comprises a NAND memory array 12b analogous to the NAND memory array 12 discussed above with reference to FIG. 1.

A second example embodiment method of fabricating a NAND memory array is described with reference to FIGS. 13-17.

Figure 13:
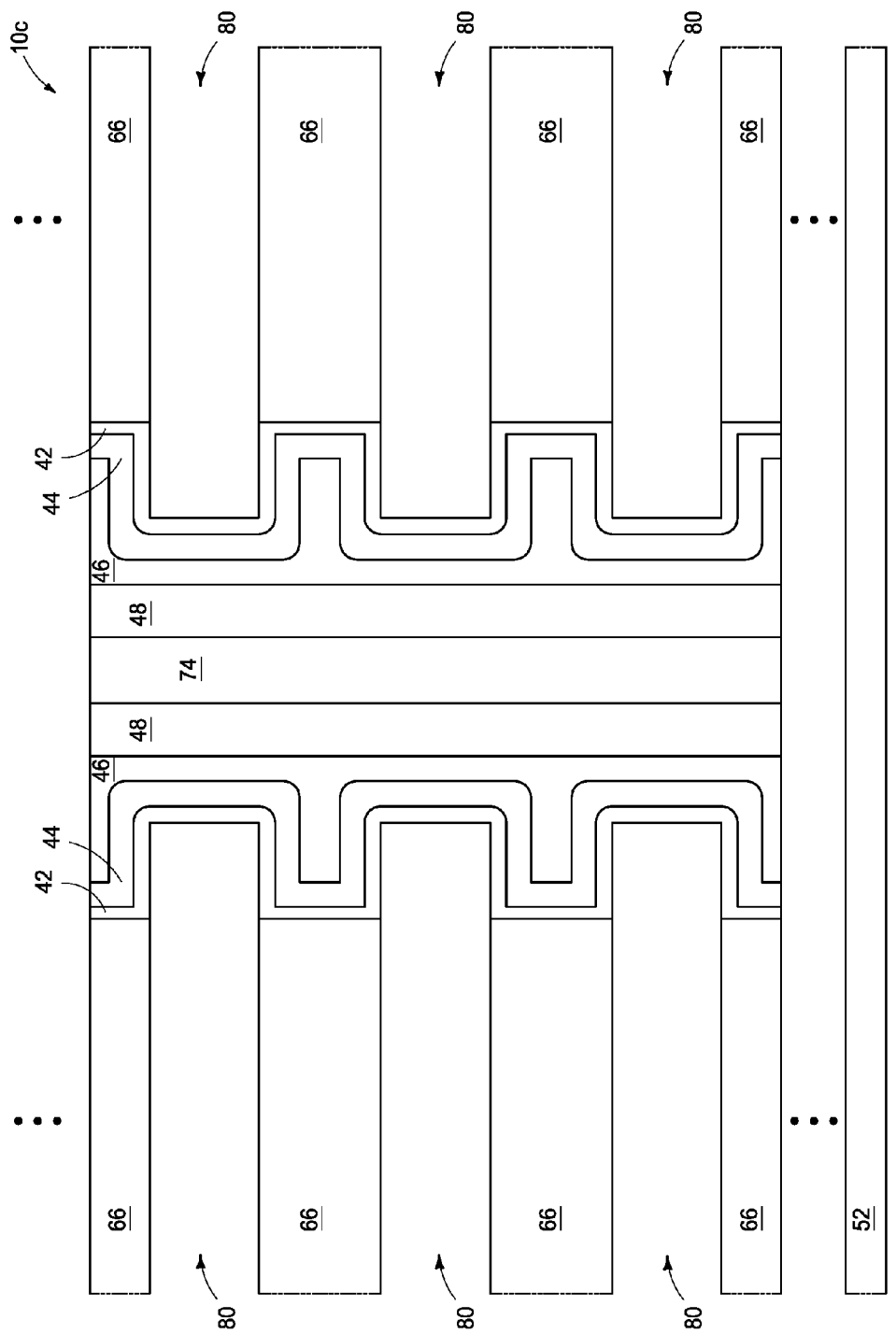
FIGS. 13-17 are diagrammatic cross-sectional side views of an example integrated structure at process stages of an example method. The process stage of FIG. 13 may follow that of FIG. 7.

Referring to FIG. 13, a construction 10c is shown at a processing stage following that of FIG. 7. The construction 10c is shown after the second material 68 (FIG. 7) is removed to leave voids 80 (the so-called "second voids"). Such removal may be accomplished with any suitable etch which is selective for the second material 68 relative to the materials 66 and 42.

Figure 14:
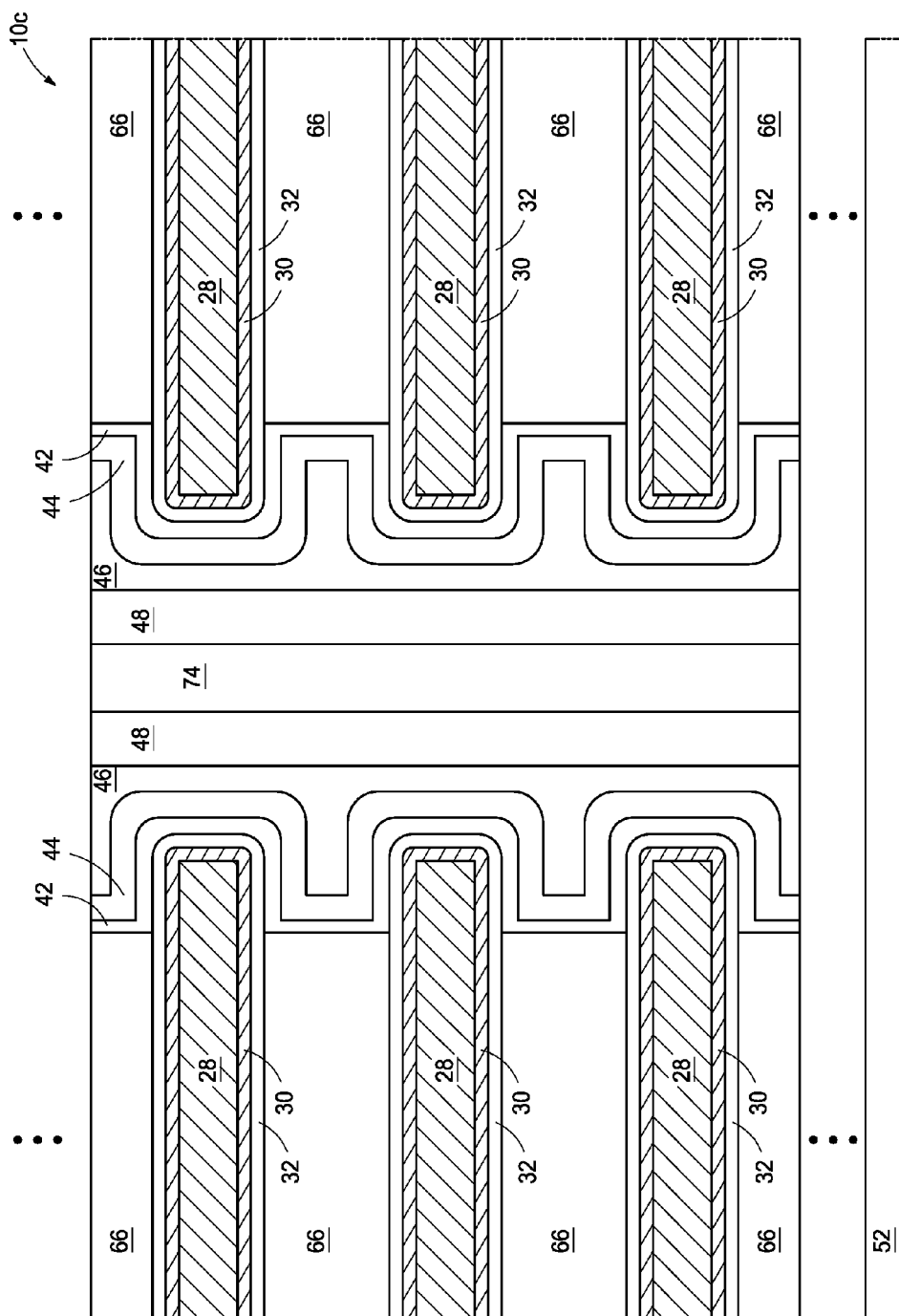

Referring to FIG. 14, materials 28, 30 and 32 are formed within the second voids 80 (FIG. 13).

Figure 15:
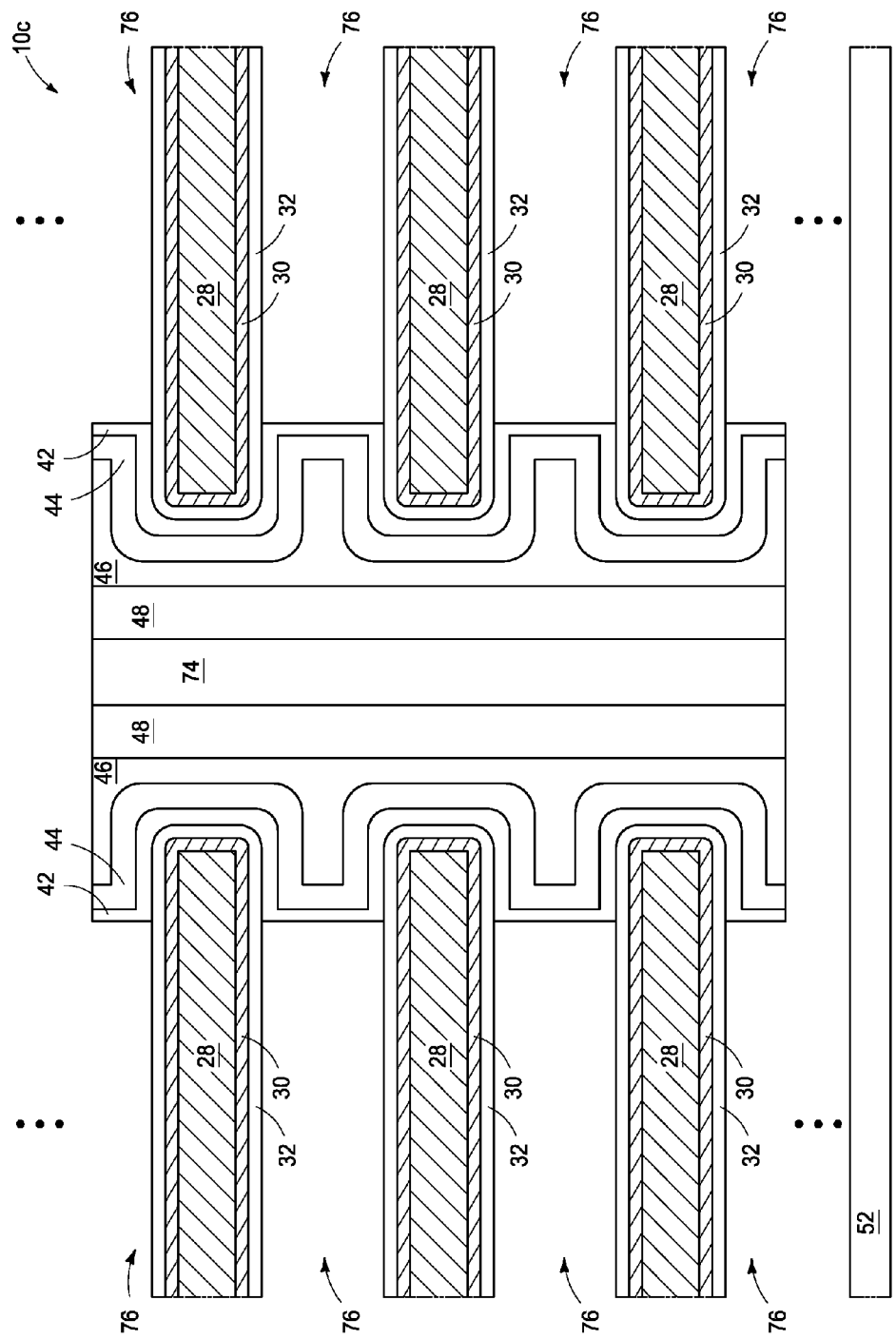

Referring to FIG. 15, the first material 66 (FIG. 14) is removed to leave voids 76 (the so-called "first voids"). Such removal may be accomplished with any suitable etch which is selective for the first material 66 relative to the charge-blocking materials 32 and 42.

Figure 16:
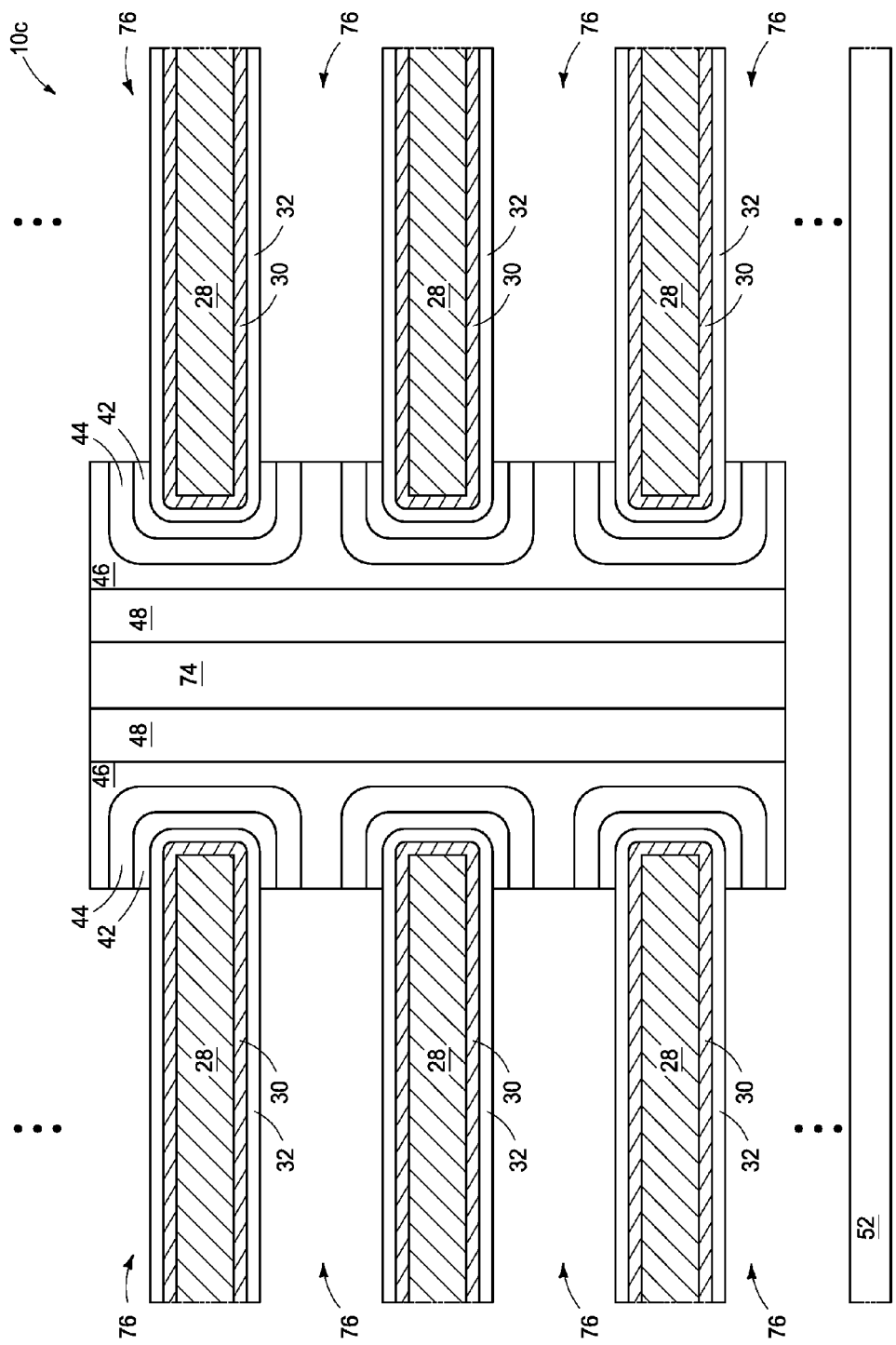

Referring to FIG. 16, the charge-blocking material 42 and charge-storage material 44 are etched with etchant provided in voids 76 in processing analogous to that described above with reference to FIG. 9.

Figure 17:
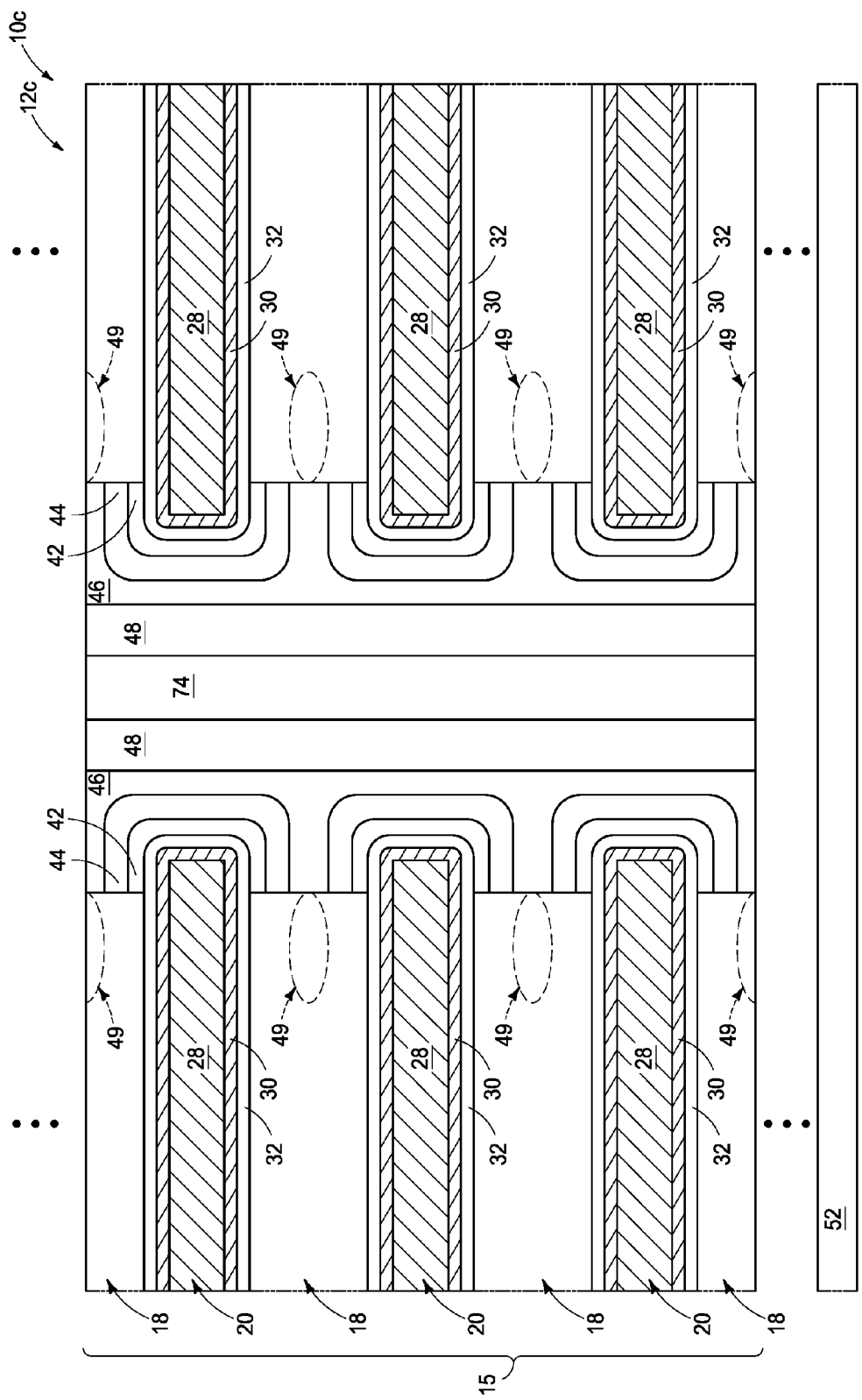

Referring to FIG. 17, insulative material 26 is formed within voids 76 (FIG. 16). The construction 10c of FIG. 17 comprises a NAND memory array 12c analogous to the NAND memory array 12 discussed above with reference to FIG. 1

A third example embodiment method of fabricating a NAND memory array is described with reference to FIGS. 18-20.

Figure 18:
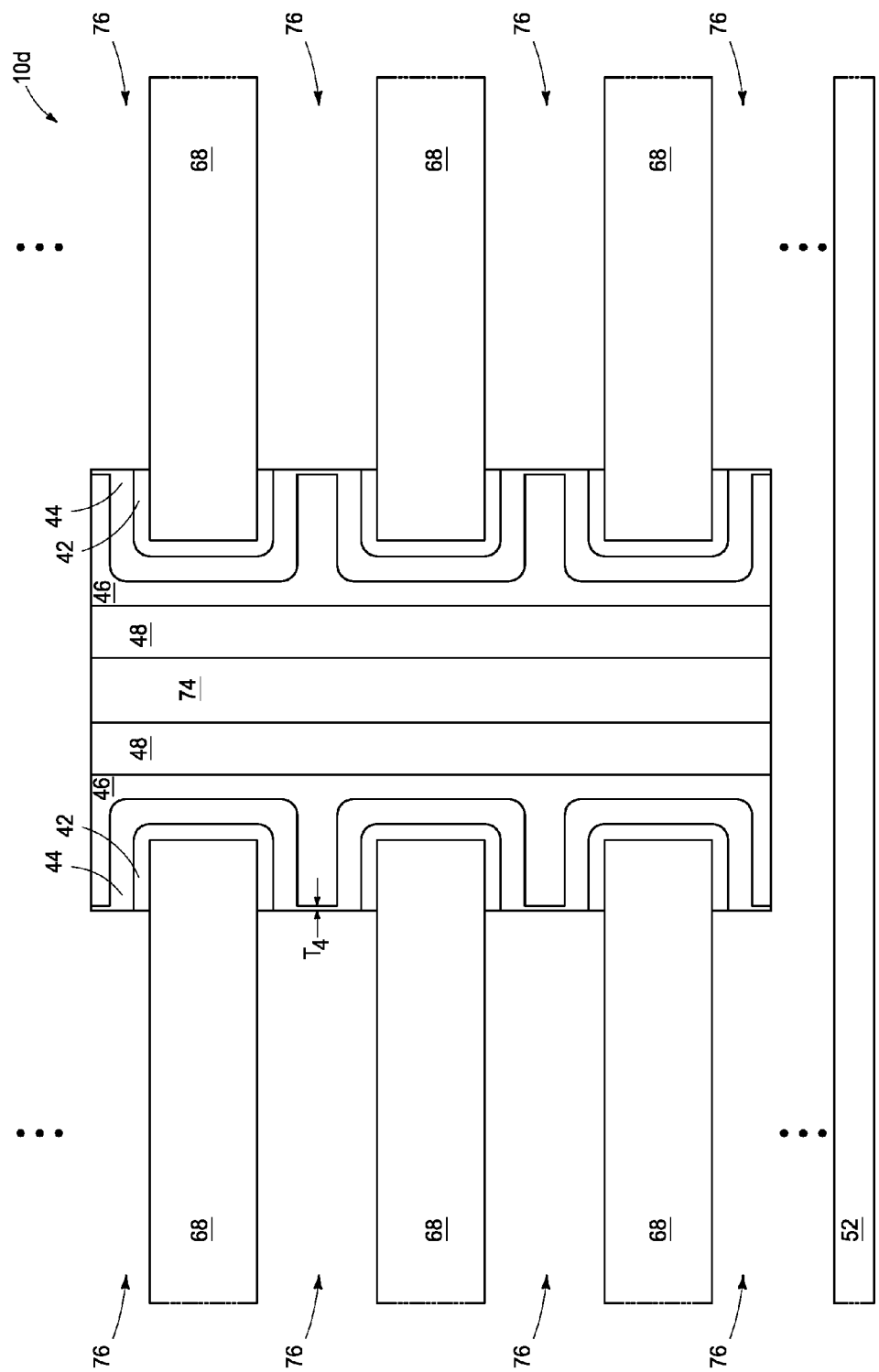
FIGS. 18-20 are diagrammatic cross-sectional side views of an example integrated structure at process stages of an example method. The process stage of FIG. 18 may follow that of FIG. 8.

Referring to FIG. 18, a construction 10d is shown at a processing stage following that of FIG. 8. The construction 10d is shown after the etch into the first voids 76 removes charge-blocking material 42 from within cavities 72, and thins charge-storage material 44. In contrast to the processing described above with reference to FIG. 9, the charge-storage material 44 is thinned, but not removed. The charge-storage material 44 may be thinned to a final thickness $T_4$ having the dimensions described above with reference to FIG. 2.

Figure 19:
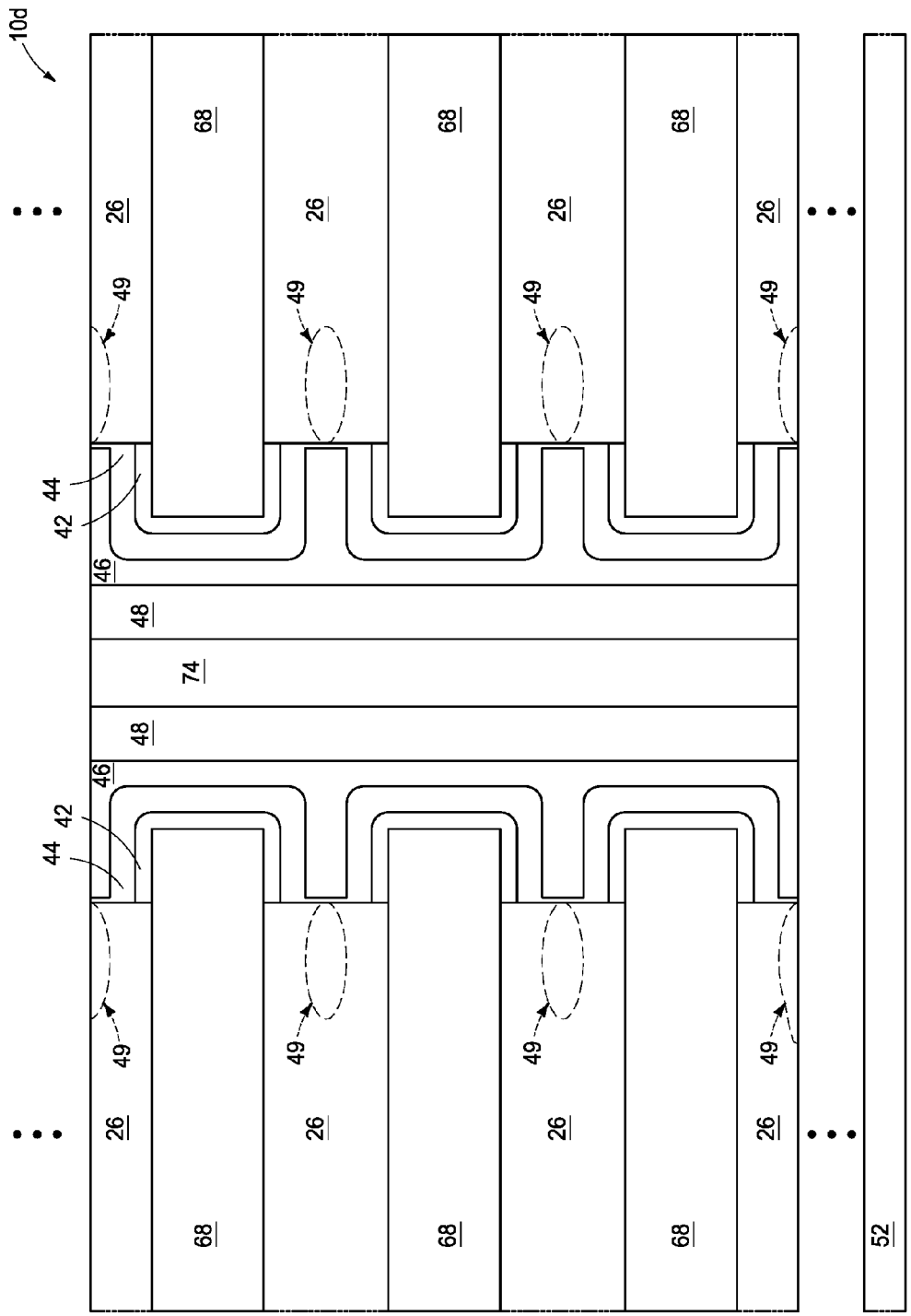

Referring to FIG. 19, insulative material 26 is formed within voids 76 (FIG. 18) with processing analogous to that described above with reference to FIG. 10.

Figure 20:
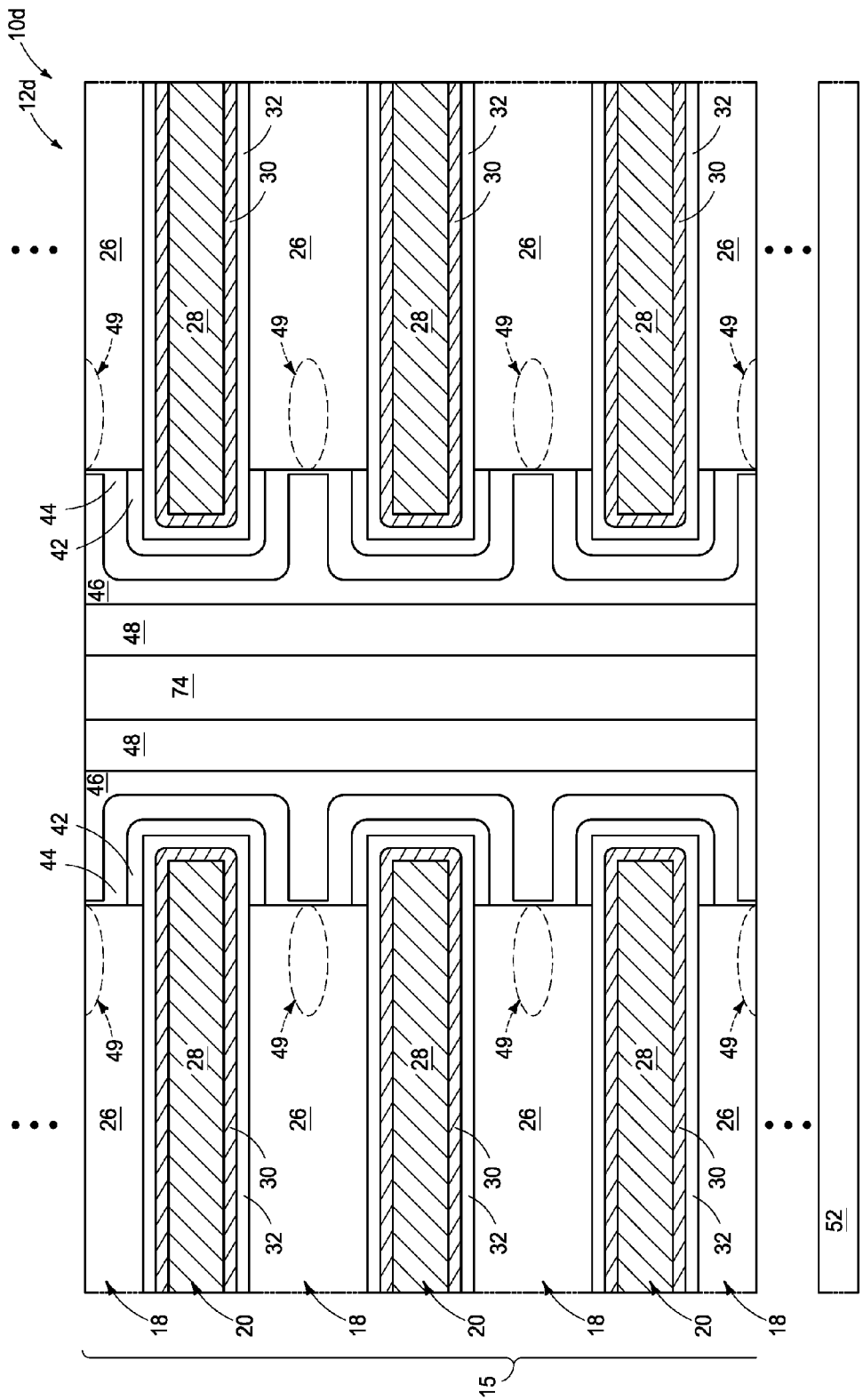

Referring to FIG. 20, the second material 68 (FIG. 19) is removed with processing analogous to that described above with reference to FIG. 11 to leave voids (like the voids 80 of FIG. 11); and then materials 28, 20 and 32 are formed within the voids with processing analogous to that described above with reference to FIG. 12.

The construction 10d of FIG. 20 comprises a NAND memory array 12d analogous to the NAND memory array 12a discussed above with reference to FIG. 2.

A fourth example embodiment method of fabricating a NAND memory array is described with reference to FIGS. 21 and 22.

Figure 21:
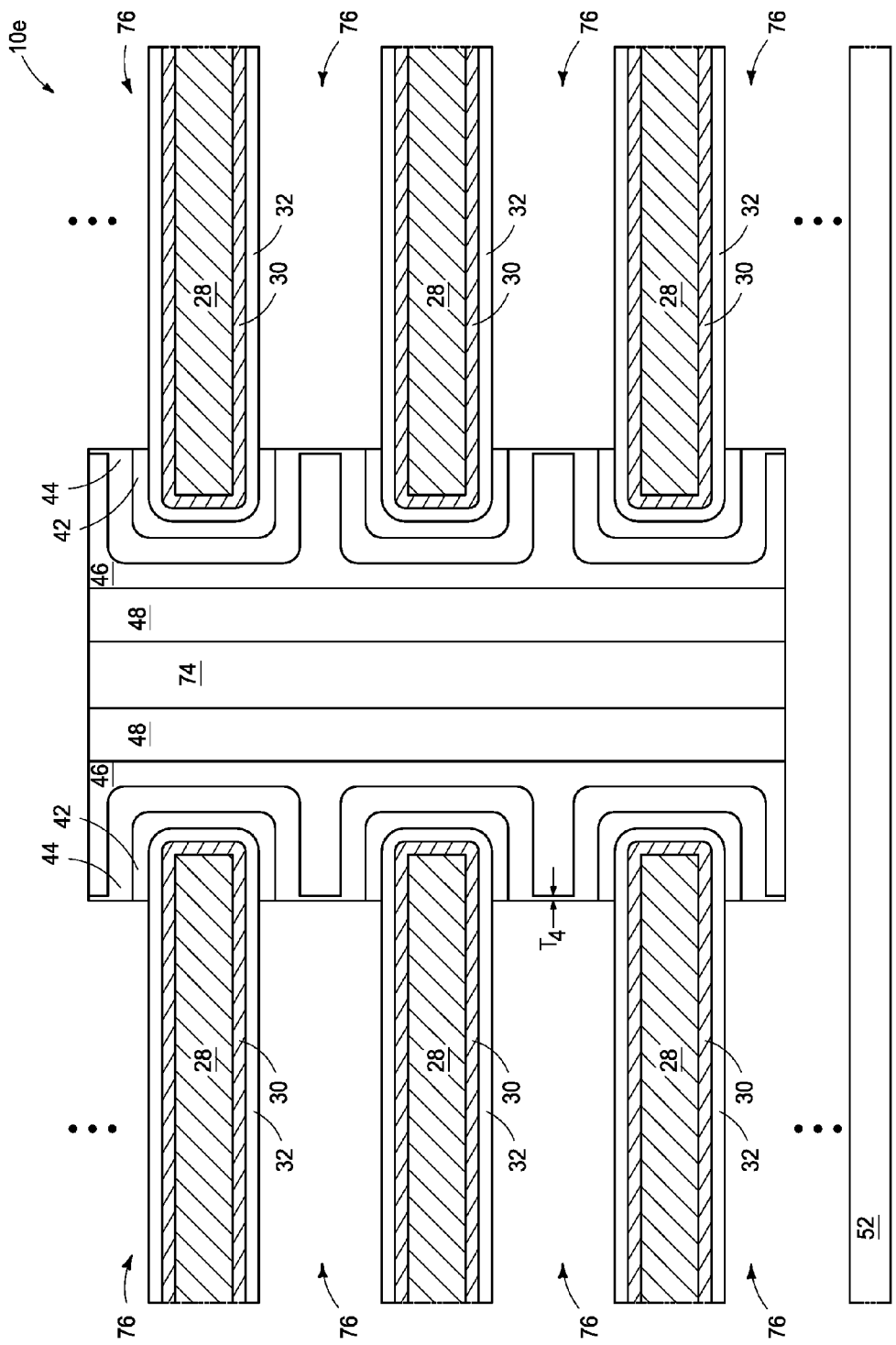
FIGS. 21 and 22 are diagrammatic cross-sectional side views of an example integrated structure at process stages of an example method. The process stage of FIG. 21 may follow that of FIG. 15.

Referring to FIG. 21, a construction 10e is shown at a processing stage following that of FIG. 15. The construction 10e is shown after the etch into the first voids 76 removes charge-blocking material 42 from within cavities 72, and thins charge-storage material 44. In contrast to the processing described above with reference to FIG. 16, the charge-storage material 44 is thinned, but not removed. The charge-storage material 44 may be thinned to a final thickness $T_4$ having the dimensions described above with reference to FIG. 2.

Figure 22:
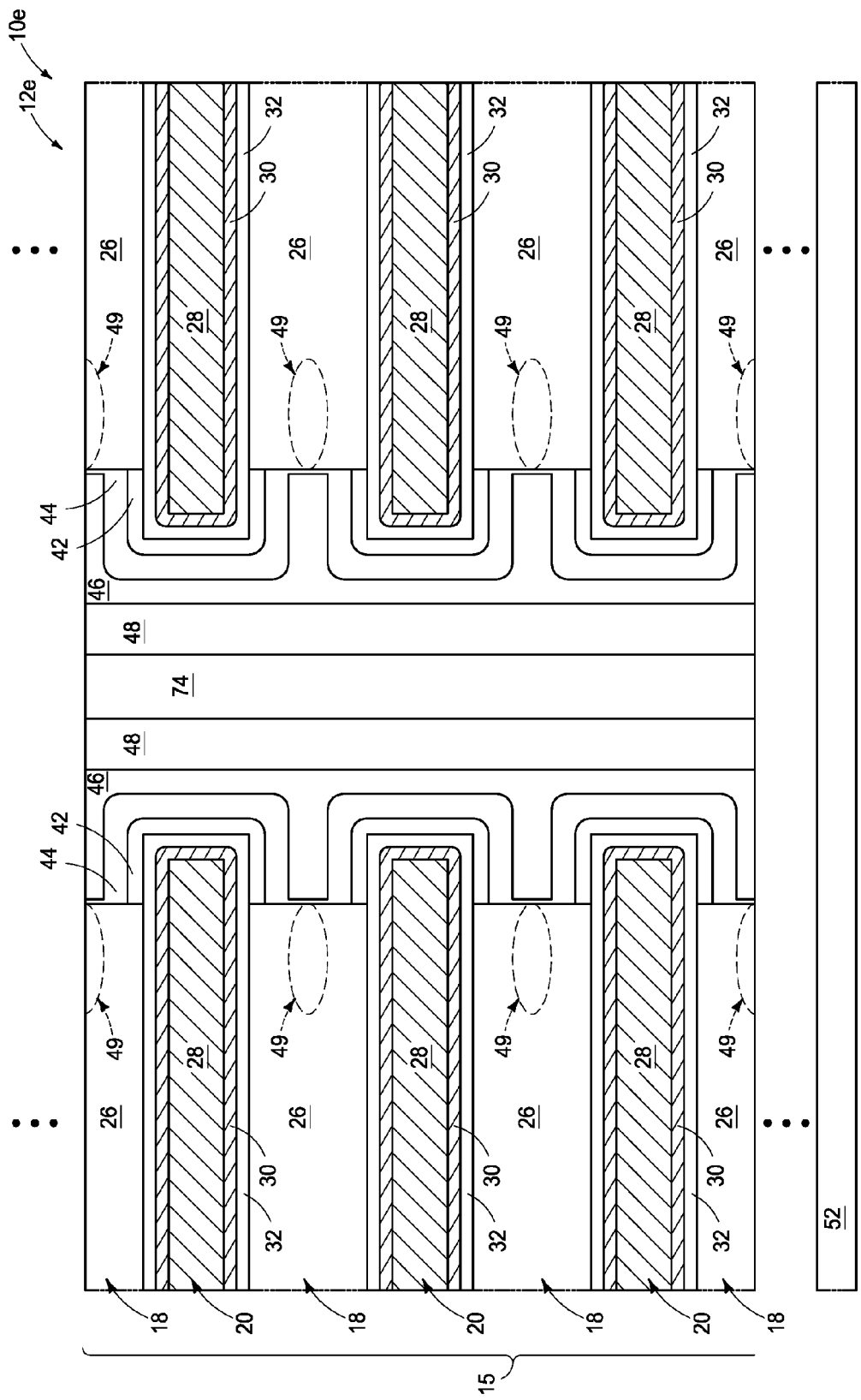

Referring to FIG. 22, insulative material 26 is formed within voids 76 (FIG. 21) with processing analogous to that described above with reference to FIG. 10.

The construction 10e of FIG. 22 comprises a NAND memory array 12e analogous to the NAND memory array 12a discussed above with reference to FIG. 2.

The structures described above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a NAND memory array which has a vertical stack of alternating insulative levels and wordline levels. The wordline levels have terminal ends corresponding to control gate regions. Charge-trapping material is along the control gate regions of the wordline levels, and is spaced form the control gate regions by charge-blocking material. The charge-trapping material along vertically adjacent wordline levels is spaced by intervening regions through which charge migration is impeded. Channel material extends vertically along the stack and is spaced from the charge-trapping material by charge-tunneling material.

Some embodiments include a NAND memory array which has a vertical stack of alternating insulative levels and wordline levels. The wordline levels have terminal ends corresponding to control gate regions. The insulative levels comprise first insulative material vertically between the wordline levels. Charge-trapping material is along the control gate regions of the wordline levels, and is spaced form the control gate regions by charge-blocking material. The charge-trapping material along vertically adjacent wordline levels is spaced by intervening regions of second insulative material which impedes charge migration. Channel material extends vertically along the stack and is spaced from the charge-trapping material by charge-tunneling material.

Some embodiments include a NAND memory array which has a vertical stack of alternating insulative levels and wordline levels. The wordline levels have terminal ends corresponding to control gate regions. The insulative levels comprise first insulative material vertically between the wordline levels. Charge-trapping material is along the control gate regions of the wordline levels, and is spaced form the control gate regions by charge-blocking material. The charge-trapping material along vertically adjacent wordline levels is spaced by intervening regions of second insulative material. The charge-trapping material comprises silicon and nitrogen. The second insulative material comprises oxide. Voids extend into the first insulative material along an interface of the first and second insulative materials. Channel material extends vertically along the stack and is spaced from the charge-trapping material by charge-tunneling material.

Some embodiments include a method of forming a NAND memory array. A vertical stack of alternating first and second levels is formed. The first levels comprise first material, and the second levels comprise second material. The first levels are recessed relative to the second levels. The second levels have projecting terminal ends extending beyond the recessed first levels. Cavities extend into the first levels between the projecting terminal ends. Charge-storage material is formed around the terminal ends of the second levels. The charge-storage material extends into the cavities to line the cavities. Charge-tunneling material is formed to extend vertically along the charge-storage material. The charge-tunneling material fills the lined cavities. Channel material is formed to extend vertically along the charge-tunneling material. The first material is removed to leave first voids. Etchant provided in the first voids is utilized to etch into the charge-storage material. Insulative third material is formed within the first voids after etching into the charge-storage material. The second material is removed to form second voids. Conductive levels are formed within the second voids. The conductive levels are wordline levels of the NAND memory array and have terminal ends corresponding to control gate regions. The control gate regions are adjacent to the charge-storage material.

Some embodiments include a method of forming a NAND memory array. A vertical stack of alternating first and second levels is formed. The first levels comprise first material, and the second levels comprise second material. The first levels are recessed relative to the second levels. The second levels have projecting terminal ends extending beyond the recessed first levels. Cavities extend into the first levels between the projecting terminal ends. First charge-blocking material is formed around the terminal ends of the second levels. Silicon nitride is formed over the first charge-blocking material and around the terminal ends of the second levels. The silicon nitride and the first charge-blocking material extend into the cavities to line the cavities. Charge-tunneling material is formed to extend vertically along the silicon nitride. The charge-tunneling material extends into the lined cavities. Channel material is formed to extend vertically along the charge-tunneling material. The first material is removed to leave first voids. The silicon nitride is etched with etchant provided in the first voids. Insulative third material is formed within the first voids after etching into the silicon nitride. The second material is removed to form second voids. The second voids are lined with second charge-blocking material. Conductive levels are formed within the lined second voids. The conductive levels are wordline levels of the NAND memory array and have terminal ends corresponding to control gate regions. The control gate regions are adjacent to the silicon nitride. Each of the conductive levels comprises a conductive core surrounded by an outer conductive layer. The conductive core comprises a different composition than the outer conductive layer.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A NAND memory array, comprising:
 a vertical stack of alternating insulative levels and wordline levels, the wordline levels having terminal ends corresponding to control gate regions;
 charge-trapping material along the control gate regions of the wordline levels, and being spaced form the control gate regions by charge-blocking material; the charge-trapping material along the wordline levels being charge-trapping material segments; the charge-trapping material segments being vertically spaced from one another by intervening regions; charge migration being impeded along said intervening regions relative to charge migration within the charge-trapping material segments; and
 channel material extending vertically along the stack and being spaced from the charge-trapping material segments by charge-tunneling material.

2. The NAND memory array of claim 1 wherein the charge-trapping material comprises silicon and nitrogen.

3. The NAND memory array of claim 1 wherein the intervening regions are gaps extending through the charge-trapping material.

4. The NAND memory array of claim 1 wherein the intervening regions are thinned regions of the charge-trapping material; the charge-trapping material along the control gate regions having a first thickness, and the thinned regions of the charge-trapping material having a second thickness which is less than one-half of the first thickness.

5. The NAND memory array of claim 4 wherein the second thickness is less than 2 nm.

6. The NAND memory array of claim 4 wherein the second thickness is less than 0.5 nm.

7. A NAND memory array, comprising:
 a vertical stack of alternating insulative levels and wordline levels, the wordline levels having terminal ends corresponding to control gate regions; the insulative levels comprising first insulative material vertically between the wordline levels;
 charge-trapping material along the control gate regions of the wordline levels, and being spaced form the control gate regions by charge-blocking material; the charge-trapping material along the wordline levels being charge-trapping material segments; the charge-trapping material segments being vertically spaced from one another by intervening regions of second insulative material; charge migration being impeded along said intervening regions relative to charge migration within the charge-trapping material segments; and
 channel material extending vertically along the stack and spaced from the charge-trapping material segments by charge-tunneling material.

8. The NAND memory array of claim 7 wherein the charge-trapping material comprises silicon and nitrogen.

9. The NAND memory array of claim 7 comprising voids extending into the first insulative material along an interface of the first and second insulative materials.

10. The NAND memory array of claim 7 wherein the first insulative material has a first vertical thickness along the interface of the first and second insulative materials, and wherein the second insulative material has a second vertical thickness along the interface of the first and second insulative materials of less than or equal to about one-half of the first vertical thickness.

11. The NAND memory array of claim 7 wherein the first and second insulative materials are a same composition as one another.

12. The NAND memory array of claim 7 wherein the first and second insulative materials are different compositions relative to one another.

13. The NAND memory array of claim 7 wherein each wordline level comprises a conductive core surrounded by an outer conductive layer; with the conductive core comprising a different composition than the outer conductive layer.

14. The NAND memory array of claim 13 wherein the conductive cores comprise one or more metals; and wherein the outer conductive layers comprise metal nitride.

15. The NAND memory array of claim 13 further comprising a high-k dielectric material surrounding the outer conductive layer of each conductive level.

16. A NAND memory array, comprising:
 a vertical stack of alternating insulative levels and wordline levels, the wordline levels having terminal ends corresponding to control gate regions; the insulative levels comprising first insulative material vertically between the wordline levels;
 charge-trapping material along the control gate regions of the wordline levels, and being spaced form the control gate regions by charge-blocking material; the charge-trapping material along the wordline levels being charge-trapping material segments; the charge-trapping material segments being vertically spaced from one another by intervening regions of second insulative material; the charge-trapping material comprising silicon and nitrogen; the second insulative material comprising oxide;
 voids extending into the first insulative material along an interface of the first and second insulative materials; and
 channel material extending vertically along the stack and spaced from the charge-trapping material segments by charge-tunneling material.

17. The NAND memory array of claim 16 wherein the first insulative material has a first vertical thickness along the interface of the first and second insulative materials, and wherein the second insulative material has a second vertical thickness along the interface of the first and second insulative materials of less than or equal to about one-half of the first vertical thickness.

18. The NAND memory array of claim 16 wherein the first and second insulative materials are a same composition as one another.

19. The NAND memory array of claim 16 wherein the first and second insulative materials are different compositions relative to one another.

20. The NAND memory array of claim 1 wherein the charge-trapping material comprises a continuous layer of material.

21. The NAND memory array of claim 1 wherein the intervening regions comprise charge-tunneling material.

22. The NAND memory array of claim 7 wherein the charge-trapping material comprises a continuous layer of material.

23. The NAND memory array of claim 7 wherein the intervening regions comprise charge-tunneling material.

24. The NAND memory array of claim 16 wherein the charge-trapping material comprises a continuous layer of material.

25. The NAND memory array of claim 16 wherein the intervening regions comprise charge-tunneling material.

* * * * *

UNITED STATES PATENT AND TRADEMARK OFFICE
CERTIFICATE OF CORRECTION

PATENT NO. : 10,431,591 B2
APPLICATION NO. : 15/422307
DATED : October 1, 2019
INVENTOR(S) : Akira Goda and Yushi Hu Page 1 of 1

It is certified that error appears in the above-identified patent and that said Letters Patent is hereby corrected as shown below:

On the Title Page

(57) Abstract: 2nd Column, 30th Line – Replace "levels, and is spaced form the control gate regions by" with --levels, and is spaced from the control gate regions by--

In the Claims

Column 11, Line 38 – Replace "spaced form" with --spaced from--

Column 12, Line 5 – Replace "spaced form" with --spaced from--

Column 12, Line 53 – Replace "spaced form" with --space from--

Signed and Sealed this
Tenth Day of December, 2019

Andrei Iancu
*Director of the United States Patent and Trademark Office*